(12) United States Patent
Burr et al.

(10) Patent No.: US 11,823,740 B2
(45) Date of Patent: Nov. 21, 2023

(54) SELECTIVE APPLICATION OF MULTIPLE PULSE DURATIONS TO CROSSBAR ARRAYS

(71) Applicant: International Business Machines Corporation, Armonk, NY (US)

(72) Inventors: Geoffrey Burr, Cupertino, CA (US); Masatoshi Ishii, Yokohama (JP); Pritish Narayanan, San Jose, CA (US); Paul Michael Solomon, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/545,671

(22) Filed: Dec. 8, 2021

(65) Prior Publication Data

US 2023/0178150 A1 Jun. 8, 2023

(51) Int. Cl.
*G11C 13/00* (2006.01)
*G06F 13/16* (2006.01)
*G06F 13/40* (2006.01)

(52) U.S. Cl.
CPC ...... *G11C 13/0061* (2013.01); *G06F 13/1684* (2013.01); *G06F 13/4022* (2013.01); *G11C 13/0004* (2013.01)

(58) Field of Classification Search
CPC ............ G11C 13/0061; G11C 13/0004; G06F 13/1684; G06F 13/4022
See application file for complete search history.

(56) References Cited

U.S. PATENT DOCUMENTS

| | | | |
|---|---|---|---|
| 7,498,787 B2 | 3/2009 | Leung et al. | |
| 9,013,165 B2 | 4/2015 | Kalje et al. | |
| 10,134,469 B1* | 11/2018 | Liu | G11C 13/0007 |
| 10,169,128 B1* | 1/2019 | Asnaashari | G06F 11/0751 |
| 10,475,511 B1* | 11/2019 | Liu | G11C 13/0028 |
| 2006/0033650 A1* | 2/2006 | Leung | H03K 7/08 341/143 |
| 2020/0356733 A1* | 11/2020 | Lesso | G06N 3/049 |
| 2021/0175893 A1* | 6/2021 | Danial | H03M 1/44 |

(Continued)

OTHER PUBLICATIONS

Chen et al., "Multiply accumulate operations in memristor crossbar arrays for analog computing," Journal of Semiconductors, vol. 42, 2021, pp. 1-22.

(Continued)

*Primary Examiner* — Henry Tsai
*Assistant Examiner* — Aurangzeb Hassan
(74) *Attorney, Agent, or Firm* — Zilka-Kotab, P.C.

(57) ABSTRACT

A computer-implemented method, according to one embodiment, includes: causing a first subset of pulse width modulators in a crossbar array of memory cells to apply respective pulses to the crossbar array together at a same start time and end the respective pulses according to a predetermined distribution of times correlated to stored pulse width data for each pulse width modulator. The method also includes causing a second subset of pulse width modulators in the crossbar array to apply pulses to the crossbar array according to the predetermined distribution of times correlated to stored pulse width data for each pulse width modulator and end the respective pulses together at a same end time.

19 Claims, 14 Drawing Sheets

(56) References Cited

U.S. PATENT DOCUMENTS

2022/0027130 A1* 1/2022 Kashmiri ............... G06F 17/16

OTHER PUBLICATIONS

Hong et al., "Low Voltage Time-Based Matrix Multiplier-and-Accumulator for Neural Computing System," Electronics, vol. 9, 2020, pp. 1-12.
Kim et al., "A Reconfigurable Digital Neuromorphic Processor with Memristive Synaptic Crossbar for Cognitive Computing," ACM Journal on Emerging Technologies in Computing Systems, vol. 11, No. 4, Article 38, Apr. 2015, 25 pages.
Jiang et al., "Pulse-Width Modulation based Dot-Product Engine for Neuromorphic Computing System Using Memristor Crossbar Array," IEEE International Symposium on Circuits and Systems, 2018, 4 pages.
Dahbi et al., "Current Spikes Minimization Method for Three-Phase Permanent Magnet Brushless DC Motor with Real-Time Implementation," Energies, vol. 11, 2018, 14 pages.
Kumar et al., "Metal oxide resistive switching memory: Materials, properties and switching mechanisms," Ceramics International, vol. 43, 2017, pp. 8547-8556.
Woo et al., "Pulse-Width Modulation Neuron Implemented by Single Positive-Feedback Device," arXiv, Oct. 2021, 4 pages, retrieved from https://arxiv.org/ftp/arxiv/papers/2108/2108.09954.pdf.

* cited by examiner

SELECTIVE APPLICATION OF MULTIPLE PULSE DURATIONS TO CROSSBAR ARRAYS

BACKGROUND

The present invention relates to crossbar arrays, and more specifically, this invention relates to selective application of a vector of pulse durations to the rows and columns of analog crossbar arrays to reduce temporal coincidence of pulse edges.

The performance characteristics of conventional random access memory (RAM) are fundamentally different from those of traditional hard disk drives (HDDs). For instance, using RAM-based solid state drives (SSDs) as an example, data in conventional implementations is typically organized in pages of 4, 8, or 16 KB sizes. Moreover, page read operations are typically one order of magnitude faster than write operations and latency neither depends on the current nor the previous location of operations.

Resistive RAM (RRAM) and Phase Change Memory (PCM) are specific types of random access memory that acts as a programmable resistor. Small voltages applied to PCM or RRAM devices for given amounts of time allows for the conductance of the corresponding cells to be determined, while larger voltages can be used to actually change the resistance of the cells. It follows that both PCM and RRAM may be used to construct analog crossbar arrays which are able to combine computation and data access. Specifically, analog crossbar arrays may be used to perform parallel read and write operations using the pulse width modulator assigned to each of the different rows and columns in the array. This combination is achieved in some instances by providing large-scale processing in memory with a multiplier and adder at each real-valued memory location.

However, the amount of system resources that are consumed while performing multiple parallel data operations that start or finish simultaneously, e.g., such as data write operations, data read operations, etc., has been undesirably high in conventional implementations of RAM, thereby leading to significant operating inefficiencies. While attempts have been made to reduce the inefficiencies that have been experienced by conventional implementations of PCM and RRAM, these attempts have been unable to maintain desirable performance. Thus, there is a desire to be able to apply vectors of unique pulse durations to the rows and columns of analog crossbar arrays within a reasonable time-window while reducing the number of temporal coincidences between pulse edges on different rows and columns.

SUMMARY

A computer-implemented method, according to one embodiment, includes: causing a first subset of pulse width modulators in a crossbar array of memory cells to apply respective pulses to the crossbar array together at a same start time and end the respective pulses according to a predetermined distribution of times correlated to stored pulse width data for each pulse width modulator. The method also includes causing a second subset of pulse width modulators in the crossbar array to apply pulses to the crossbar array according to the predetermined distribution of times correlated to stored pulse width data for each pulse width modulator and end the respective pulses together at a same end time.

A computer program product, according to another approach, includes a computer readable storage medium having program instructions embodied therewith. Moreover, the program instructions are readable and/or executable by a processor to cause the processor to: assign, by the processor, random first register values to pulse width modulators in a crossbar array of memory cells. The program instructions are also readable and/or executable by the processor to cause the processor to: cause, by the processor, the pulse width modulators to apply respective pulses to the crossbar array according to a first predetermined distribution of times correlated to the random first register values, in addition to causing, by the processor, the pulse width modulators to end their respective pulses according to a second predetermined distribution of times correlated to stored pulse width data for each pulse width modulator.

A system, according to yet another embodiment, includes: a processor, and logic that is integrated with the processor, executable by the processor, or integrated with and executable by the processor. Moreover, the logic is configured to: assign, by the processor, register values to pulse width modulators in a crossbar array of memory cells, where the register values assigned to the pulse width modulators are correlated to respective pulse widths assigned to the pulse width modulators. The logic is also configured to: cause, by the processor, the pulse width modulators to apply respective pulses to the crossbar array. Causing a given one of the pulse width modulators to apply a respective pulse to the crossbar array also includes: using all bits except for a least significant bit in the register value assigned to the given pulse width modulator to determine a partial excitation period, and dividing the partial excitation period in half. The given pulse width modulator further applies a pulse to the crossbar array for a first half of the partial excitation period, and the given pulse width modulator continues applying the pulse to the crossbar array for a second half of the partial excitation period.

Other aspects and embodiments of the present invention will become apparent from the following detailed description, which, when taken in conjunction with the drawings, illustrate by way of example the principles of the invention.

DETAILED DESCRIPTION

Figure 1:
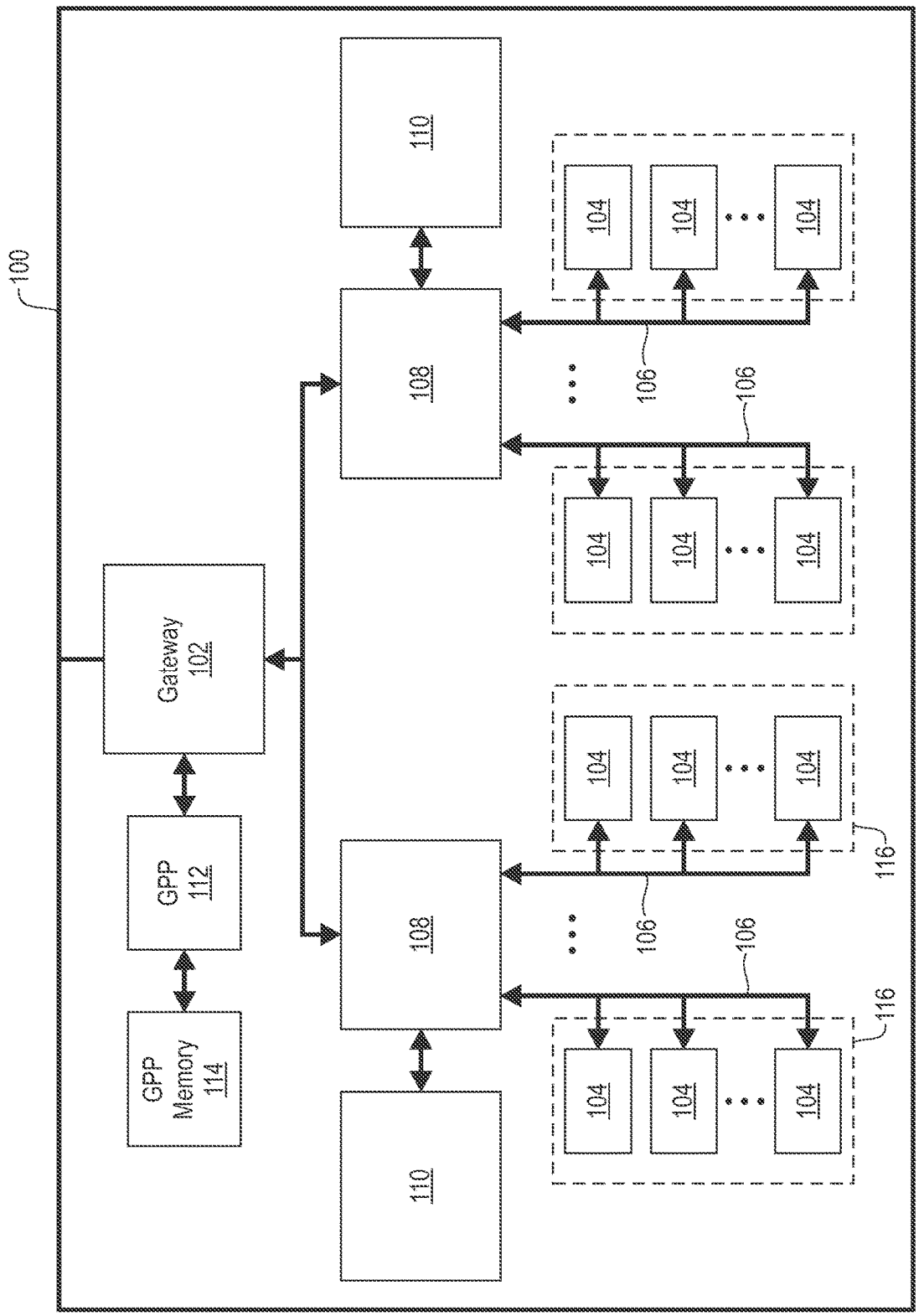
FIG. 1 is a partial schematic diagram of a non-volatile memory module, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of crossbar arrays, as well as operation and/or component parts thereof for significantly reducing the number of rising and falling pulse edges applied in crossbar arrays that coincide. By selectively controlling pulse width modulators to implement the pulses in a particular manner as described in the various approaches included herein, the strain placed on systems and components therein (e.g., such as a current and/or voltage sources) is significantly lessened by reducing the current draw experienced at any given time and increases efficiency as a whole, e.g., as will be described in further detail below.

It should also be appreciated that various embodiments herein may be implemented with a wide range of memory mediums, including for example non-volatile RAM (NVRAM) technologies such as resistive RAM (RRAM), spin-transfer torque RAM (STT-RAM), phase-change memory (PCM), magnetoresistive RAM (MRAM), etc. However, to provide a context and assist the reader, various embodiments included herein may be described with reference to specific types of non-volatile memory, e.g., such as RRAM and PCM. This has been done by way of example only, and should not be deemed limiting on the invention.

In one general embodiment, a computer-implemented method includes: causing a first subset of pulse width modulators in a crossbar array of memory cells to apply respective pulses to the crossbar array together at a same start time and end the respective pulses according to a predetermined distribution of times correlated to stored pulse width data for each pulse width modulator. The method also includes causing a second subset of pulse width modulators in the crossbar array to apply pulses to the crossbar array according to the predetermined distribution of times correlated to stored pulse width data for each pulse width modulator and end the respective pulses together at a same end time.

In another general embodiment, a computer program product includes a computer readable storage medium having program instructions embodied therewith. Moreover, the program instructions are readable and/or executable by a processor to cause the processor to: assign, by the processor, random first register values to pulse width modulators in a crossbar array of memory cells. The program instructions are also readable and/or executable by the processor to cause the processor to: cause, by the processor, the pulse width modulators to apply respective pulses to the crossbar array according to a first predetermined distribution of times correlated to the random first register values, in addition to causing, by the processor, the pulse width modulators to end their respective pulses according to a second predetermined distribution of times correlated to stored pulse width data for each pulse width modulator.

In yet another general embodiment, a system includes: a processor, and logic that is integrated with the processor, executable by the processor, or integrated with and executable by the processor. Moreover, the logic is configured to: assign, by the processor, register values to pulse width modulators in a crossbar array of memory cells, where the register values assigned to the pulse width modulators are correlated to respective pulse widths assigned to the pulse width modulators. The logic is also configured to: cause, by the processor, the pulse width modulators to apply respective pulses to the crossbar array. Causing a given one of the pulse width modulators to apply a respective pulse to the crossbar array also includes: using all bits except for a least significant bit in the register value assigned to the given pulse width modulator to determine a partial excitation period, and dividing the partial excitation period in half. The given pulse width modulator further applies a pulse to the crossbar array for a first half of the partial excitation period, and the given pulse width modulator continues applying the pulse to the crossbar array for a second half of the partial excitation period.

FIG. 1 illustrates a memory module 100, in accordance with one embodiment. It should be noted that although memory module 100 is depicted as an exemplary non-volatile data storage module in the present embodiment, various other types of non-volatile data storage modules may be used in a data storage system according to alternate embodiments. It follows that the architecture and/or components of memory module 100 are in no way intended to limit the invention, but rather have been presented as a non-limiting example.

Moreover, as an option, the present memory module 100 may be implemented in conjunction with features from any other embodiment listed herein, such as those described with reference to the other FIGS. However, such memory module 100 and others presented herein may be used in various applications and/or in permutations which may or may not be specifically described in the illustrative embodiments listed herein. Further, the memory module 100 presented herein may be used in any desired environment.

With continued reference to FIG. 1, memory module 100 includes a gateway 102, a general purpose processor (GPP) 112 (such as an ASIC, FPGA, CPU, etc.) connected to a GPP memory 114 (which may include RAM, ROM, battery-backed DRAM, phase-change memory PC-RAM, MRAM, STT-MRAM, etc., or a combination thereof), and a number of memory controllers 108. Each memory controller 108 is connected to a plurality of RAM modules 104 (e.g., memory circuits) via channels 106. Moreover, subsets of the RAM modules 104 are arranged to form dual in-line memory modules (DIMMs) 116. In some approaches the RAM modules 104 may actually include RRAM, but it should be noted that the various RAM modules 104 may include any other type(s) of non-volatile memory in other approaches.

According to various embodiments, one or more of the controllers 108 may be and/or include one or more processors, and/or any logic for controlling any subsystem of the memory module 100. For example, the controllers 108 typically control the functions of RAM modules 104, e.g., such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, one or more of the controllers 108 may be configured and/or programmable to perform or control some or all of the methodology presented herein. Thus, one or more of the controllers 108 may be considered to be configured to perform various operations by way of logic programmed into one or more chips, modules, blocks, etc.; software, firmware, other instructions being available to one or more processors, etc.; etc., and/or combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof. Moreover, memory module 100 may be implemented in various types of data storage systems, depending on the desired embodiment.

As previously mentioned, RAM and the corresponding LSA architectures implement out-of-place data storage. Accordingly, a memory page overwrite will result in writing the memory page data to a new location in memory, marking the old copy of the memory page data as invalid, and then updating the mapping information. It follows that each data operation involves accessing a different storage location in the RAM.

Moreover, RRAM is a specific type of random access memory that acts as a programmable resistor. Specifically, small voltages applied to RRAM for given amounts of time allows for the conductance of the corresponding cells to be determined, while larger voltages can be used to actually change the resistance of the cells. It follows that RRAM may be used to construct analog crossbar arrays which are able to combine computation and data access. This combination is achieved in some instances by providing large-scale processing in memory with a multiplier and adder at each real-valued memory location. Analog crossbar arrays are thereby able to perform parallel read and write operations using the pulse width modulators assigned to the different rows and columns in the array.

However, the amount of system resources that are consumed while performing multiple data operations in parallel, e.g., such as multiply and accumulate operations, data write operations, data read operations, etc., has been undesirably high in conventional implementations of RRAM, thereby leading to significant operating inefficiencies. For instance, pulse width modulators are involved with providing a formulation in which each row excitation is applied as a different length pulse. However, applying different pulses to different rows in parallel introduces a challenge into the circuit, in terms of instantaneous draw on current supplies for pulse propagation, and for current arriving at a measurement circuit tasked with holding a particular common-mode voltage.

These conventional implementations have thereby been plagued by undesirably high operating inefficiencies. Attempts to reduce these inefficiencies have been made by decreasing the number of data operations that are performed in parallel, but this also undesirably reduces the achievable throughput of the system, thereby ultimately increasing latency and reducing data access times.

Other attempts have been made to reduce these inefficiencies by bit-slicing inputs while observing one equal-length integration time-period for each bit of data. However, in order to scale the output correctly, the integrated output in each bit-sliced time-period is scaled by 2n, where "n" is zero or the appropriate positive integer reflecting the importance of the particular bit-slice. This approach thereby introduces a significant amount of quantization error unless each bit-sliced integration time-period is long enough to measure a signal of sufficient dynamic range.

In sharp contrast to the shortcomings found in conventional implementations, various ones of the embodiments included herein are desirably able to perform multiple data operations in parallel while also reducing the negative impact these parallel operations have on the overarching system. For instance, by selectively changing the shape of the pulses used to actually access the memory locations where data is stored, different ones of the embodiments herein are able to control the resources that are consumed by a storage system while performing data operations therein, e.g., as will be described in further detail below.

Figure 2:
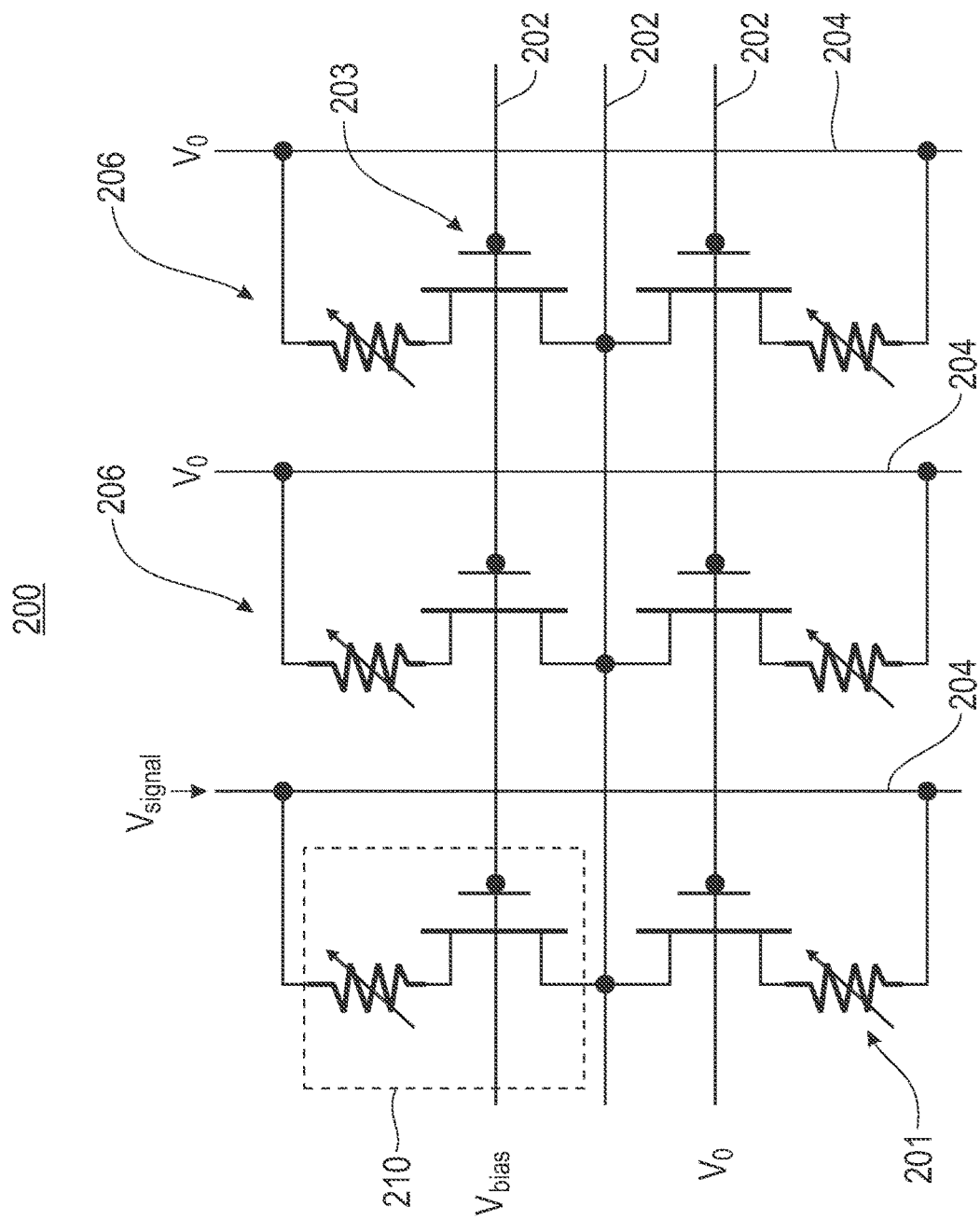
FIG. 2 is a partial schematic view of an analog crossbar array in RRAM, in accordance with one embodiment.

Looking now to FIG. 2, a partial, detailed schematic view of an analog crossbar array 200 in RRAM is depicted in accordance with one embodiment. As an option, the present crossbar array 200 may be implemented in conjunction with features from any other embodiment listed herein, such as those described with reference to the other FIGS., such as FIGS. 4A-6B below. However, such crossbar array 200 and others presented herein may be used in various applications and/or in permutations which may or may not be specifically described in the illustrative embodiments listed herein. Further, the crossbar array 200 presented herein may be used in any desired environment. Thus FIG. 2 (and the other FIGS.) may be deemed to include any possible permutation.

As shown, a number of resistor 201 and transistor 203 pairs are connected across a multitude of word lines 202 and bit lines 204 to form memory cells 206. Although these memory cells 206 are arranged in a grid-like pattern, the word lines 202 and bit lines 204 may be used to access any desired one of the memory cells 206. In other words, each of the memory cells 206 has a unique excitation vector that is associated therewith. These excitation vectors may further be implemented onto multiple different ones of the word lines 202 and/or bit lines 204 in order to perform operations like multiply, accumulate, etc., operations across an entire matrix of stored weights, e.g., as would be appreciated by one skilled in the art after reading the present description. Moreover, these weights may actually be encoded into the conductance values of analog RRAM in some approaches.

Looking to selected memory cell 210, a bias voltage $V_{bias}$ is applied to the gate terminal of the transistor 203 along the word line 202, thereby activating each of the transistors connected to the same word line 202. An electrical signal $V_{signal}$ is also applied to the bit line connected to the resistor 201 of the selected memory cell 210 for a predetermined amount of time in order to actually access the selected memory cell 210. The remainder of the word lines 202 and bit lines 204 have no voltage applied thereto Vo which effectively keeps the corresponding circuits open and the various memory cells 206 other than the selected one 210 inactive, e.g., as would be appreciated by one skilled in the art after reading the present description.

It should also be noted that although not specifically depicted in FIG. 2, each of the word lines 202 and/or bit lines 204 include a pulse width modulator. For instance, although the bias voltage $V_{bias}$ associated with each of the transistors 203 may be predetermined, e.g., based on the configuration of the transistors themselves, and thereby applied relatively simply, the electrical signal $V_{signal}$ may vary depending on the particular situation. For instance, the pulse width of the electrical signal $V_{signal}$ applied to a given bit line 204 may dictate which of the transistors are actually accessed and how.

Figure 3:
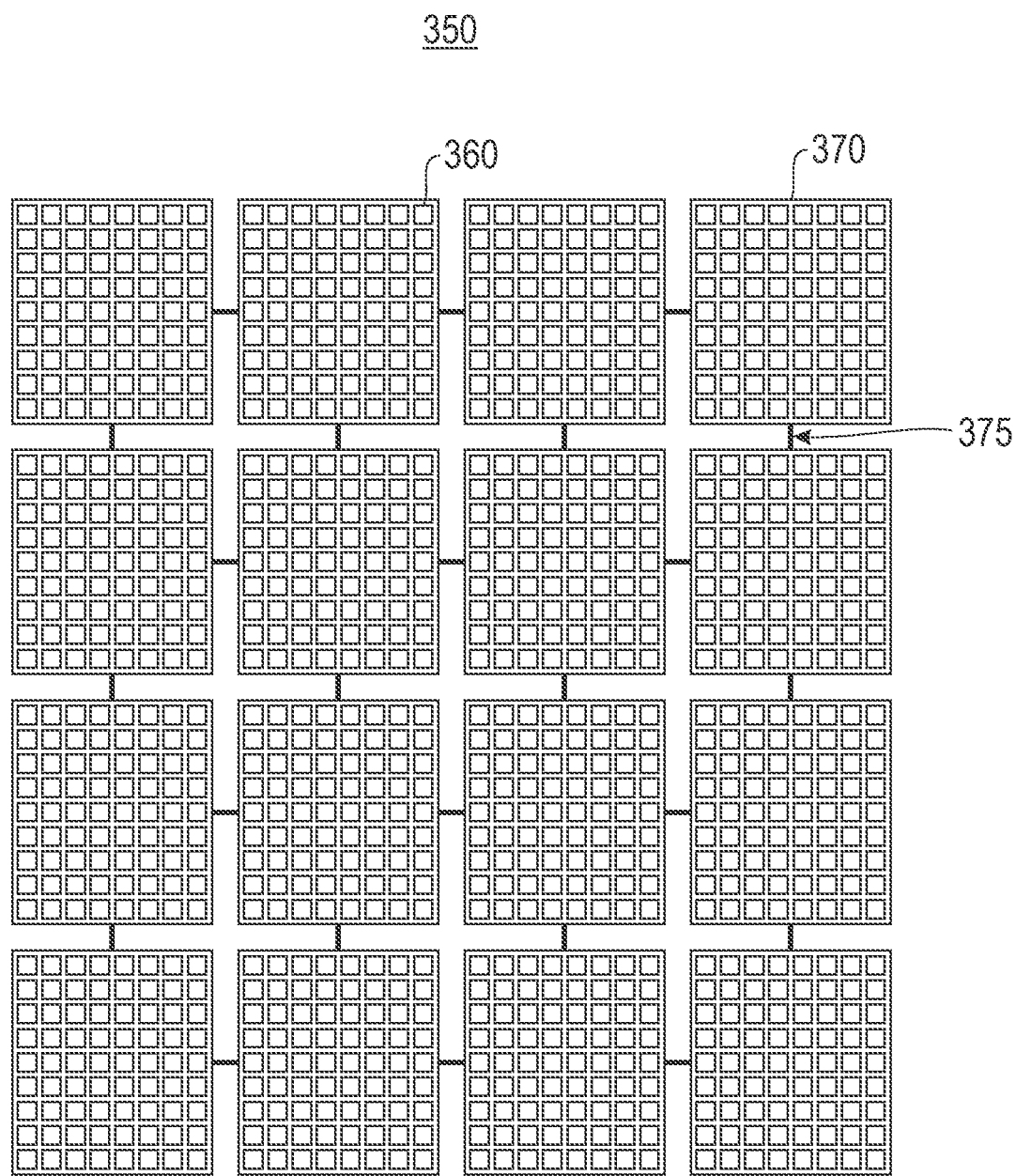
FIG. 3 is a partial representational view of a neural network, in accordance with one embodiment.

Moreover, looking to FIG. 3, an example of a neural network 350 is illustrated in accordance with one embodiment. As shown, the neural network 350 is a scalable neuromorphic architecture which includes multiple chip structures 370. Each chip structure 370 is illustrated as including multiple different cores 360. An event routing system 375 of the neural network 350 may also be used to route excitation events between each of the cores 360 of the chip structures 370. A core 360 of the neural network 350 may even send excitation event information to, and receive excitation event information from, a different core 360 of the same chip structure 370 or a different chip structure, e.g., depending on the approach.

It follows that neural network 350 is effectively a hardware-based neural network that is able to efficiently perform large-scale parallel multiply-accumulation (MAC) operations e.g., based on Ohm's and Kirchhoff's laws. By introducing excitation vectors onto multiple row-lines in order to perform multiply and accumulate operations across an entire matrix of stored weights encoded into the conductance values of analog nonvolatile resistive memories, a crossbar array (e.g., see 200 of FIG. 2) is desirably able to perform parallel vector-multiply operations. Thus, by providing pulse width modulator variation in different manners, some of the approaches included herein are able to provide sufficient accuracy and a larger bit-precision than conventionally achievable without introducing latency, while also exponentially reducing power consumption.

Figure 4A:
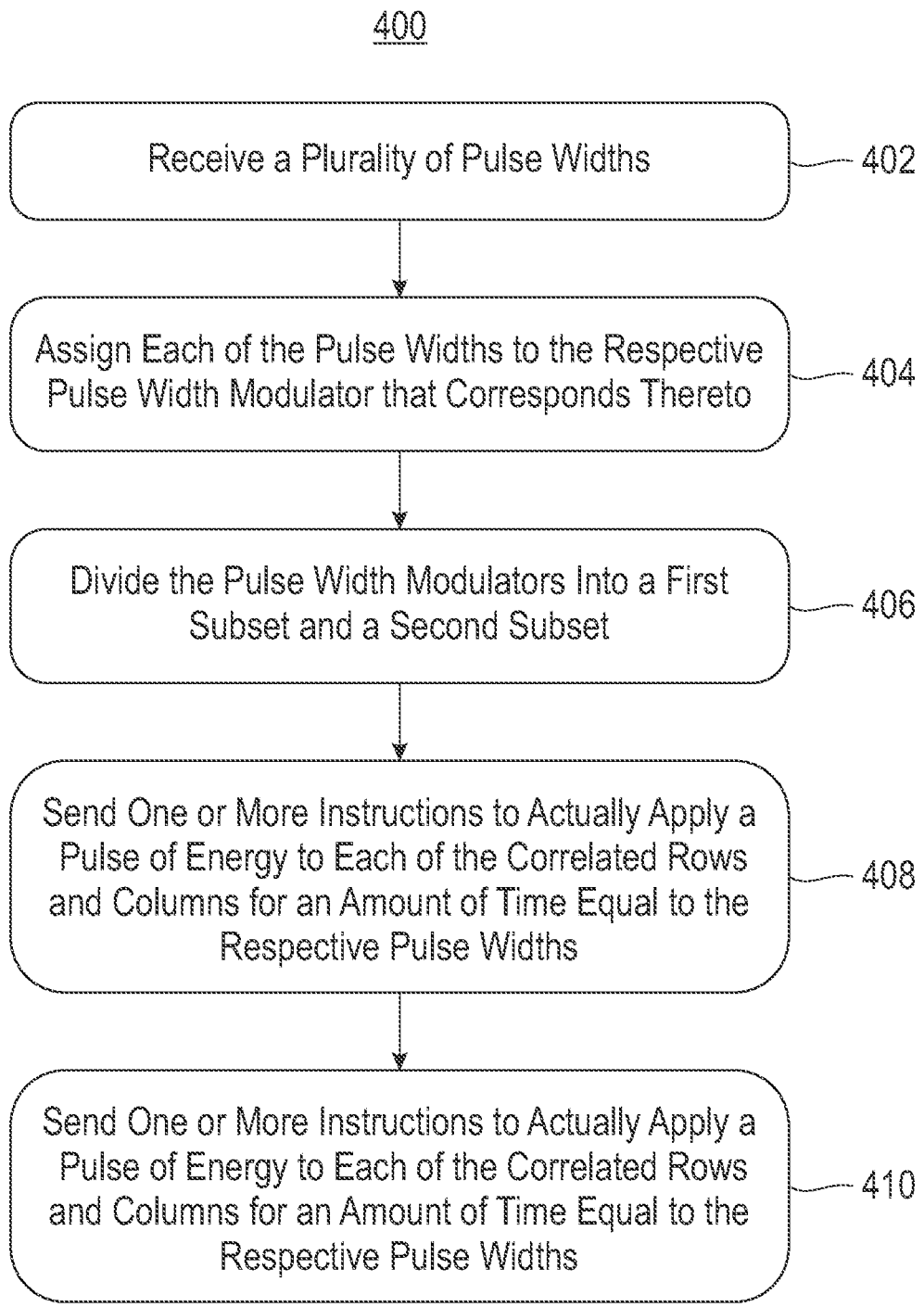
FIG. 4A is a flowchart of a method, in accordance with one embodiment.
Figure 5A:
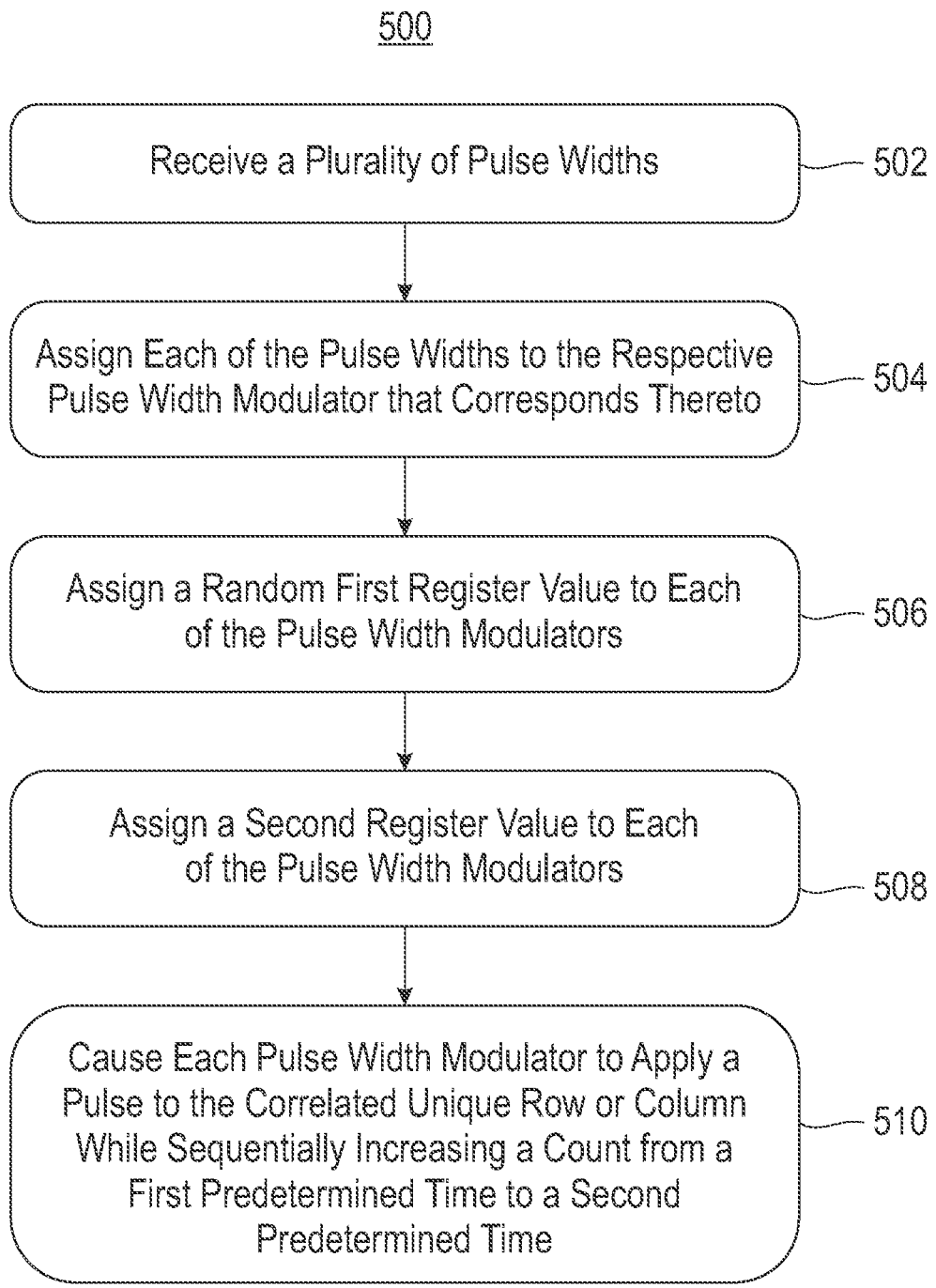
FIG. 5A is a flowchart of a method, in accordance with one embodiment.
Figure 6A:
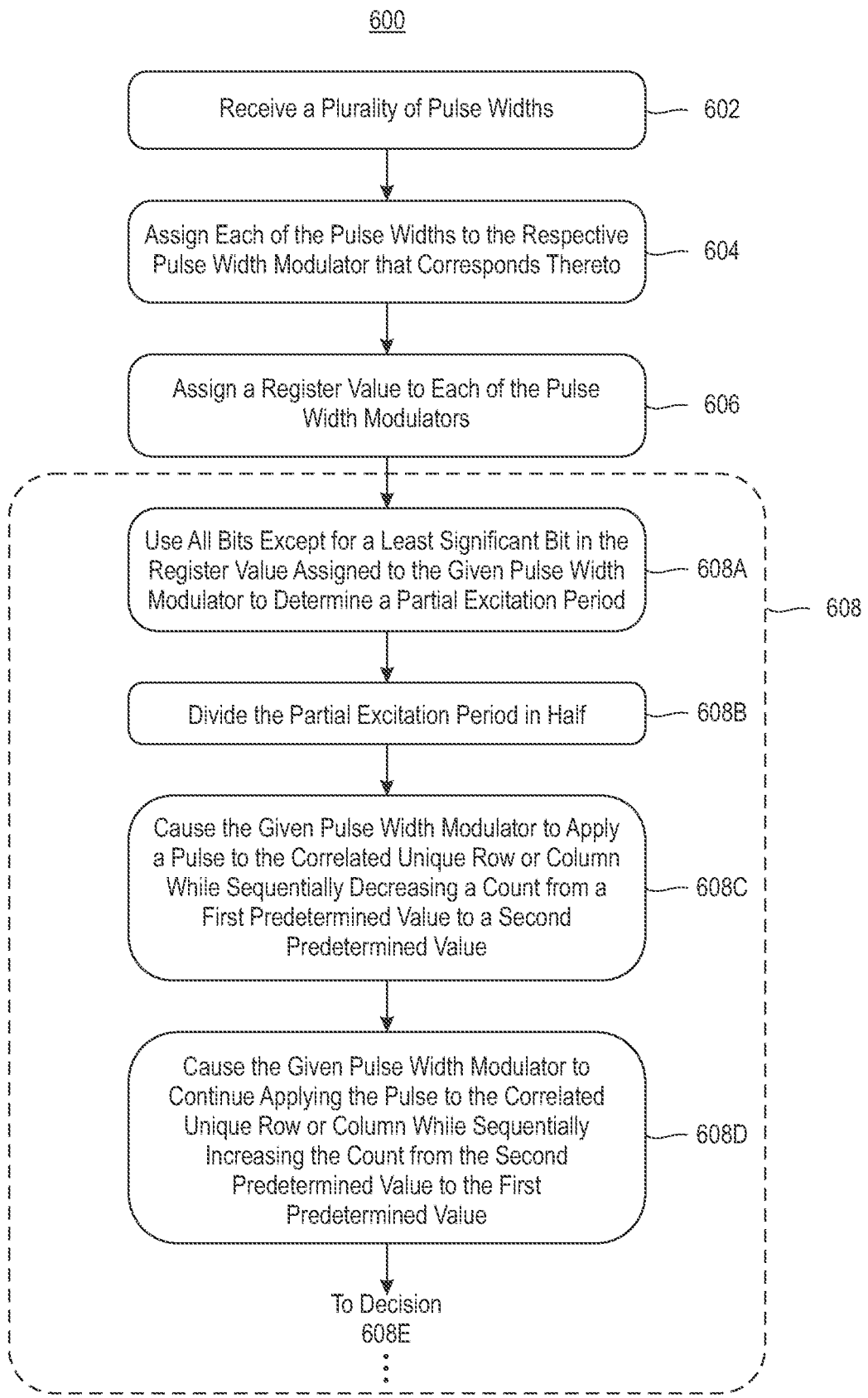
FIG. 6A is a flowchart of a method, in accordance with one embodiment.
Figure 6A:
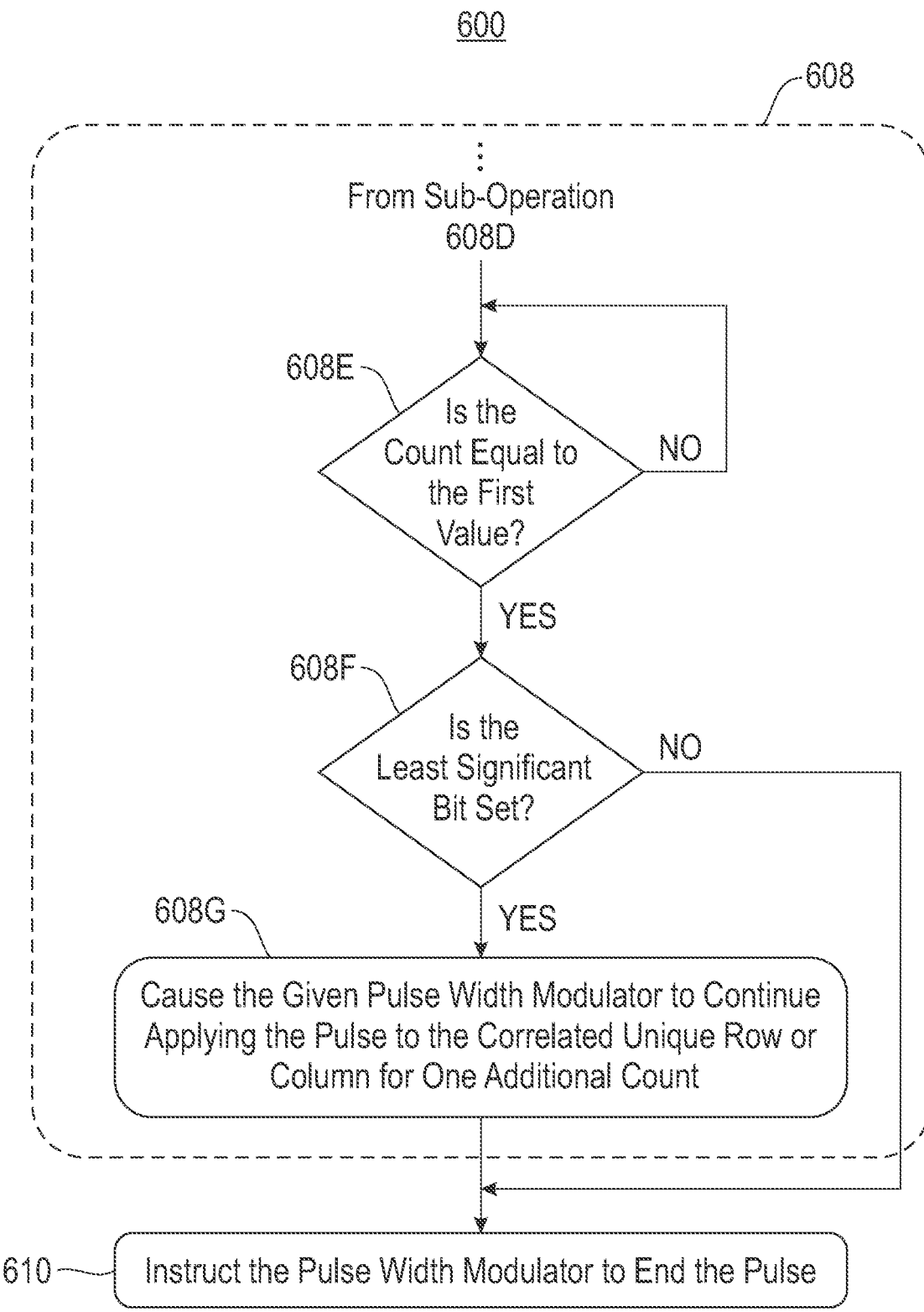

For instance, looking now to FIGS. 4A, 5A, 6A, flowcharts of three different methods 400, 500, 600 for reducing instantaneous current spikes in an analog crossbar array during multiply-accumulate operations are shown. These improvements may result from shifting input pulses to reduce the number of simultaneous signal edges that are experienced, e.g., as will be described in further detail below. The different methods 400, 500, 600 may be performed in accordance with the present invention in any of the environments depicted in FIGS. 1-3, among others, in various embodiments. Of course, more or less operations than those specifically described in FIGS. 4A, 5A, 6A may be included in any of methods 400, 500, 600, as would be understood by one of skill in the art upon reading the present descriptions.

Each of the steps of the different methods 400, 500, 600 may be performed by any suitable component of the operating environment. For example, in some embodiments any one or more of the processes included in methods 400, 500, 600 may be performed by a central storage controller in communication with (e.g., coupled to) various pulse width modulators. In various other embodiments, any of the methods 400, 500, 600 may be partially or entirely performed by a controller, a processor, a computer, etc., or some other device having one or more processors therein. Moreover, the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of any of the methods 400, 500, 600. Illustrative processors include, but are not limited to, a central processing unit (CPU), an application specific integrated circuit (ASIC), a field programmable gate array (FPGA), etc., combinations thereof, or any other suitable computing device known in the art.

Looking first to FIG. 4A, operation 402 of method 400 includes receiving a plurality of pulse widths, each of which corresponds to a respective pulse width modulator. With respect to the present description, the "pulse width" represents a measurement that indicates the desired amount of time that elapses between the leading and trailing edges of a single pulse of energy. A pulse width may thereby be applied by a pulse width modulator by supplying a pulse of energy for an excitation period that is equal to the pulse width, e.g., as would be appreciated by one skilled in the art after reading the present description.

It should also be noted that the pulse widths may be received from a user, a running application, a lookup table, etc. Moreover, although the pulse widths are illustrated as being received in the present embodiment, the pulse widths may be calculated based on past operations, determined using industry standards, dictated by the types of memory and/or components therein, etc.

As noted above, pulse width modulators may be used to apply energy pulses of certain lengths (e.g., durations) to specific ones of the linear extensions (e.g., rows and/or columns) in a crossbar array. In such approaches, each pulse width modulator may correlate with a unique row or column in an analog crossbar array. It follows that the use of the terms "row" and "column" as used herein are in no way intended to limit the invention. In some approaches columns and rows may even be used interchangeably, e.g., depending on the configuration of the crossbar array and/or the components included therein. The analog crossbar array may further be implemented in resistive memory in some instances, e.g., such as RRAM or PCM. Each of the pulse width modulators may thereby be correlated with a specific row or column of RRAM or PCM circuitry.

In some approaches, the pulse widths themselves may identify which of the pulse width modulators they are correlated with. For instance, the pulse widths may include metadata which indicates which pulse width modulator is associated with each of the pulse widths. However, the correlation between the pulse widths and the pulse width modulators may be established using any desired information and/or processes. Accordingly, operation 404 includes assigning each of the pulse widths to the respective pulse width modulator that corresponds thereto.

A specific pulse width may be assigned to a given pulse width modulator in some approaches by storing a value representing the pulse width in pulse width modulator internal memory. For instance, a pulse width modulator may include a metadata header, a lookup table, a pulse queue, etc., that may be used to store one or more pulse widths therein.

While a respective pulse width may be assigned to each of the pulse width modulators, the pulse width modulators themselves may implement the pulse widths differently. For instance, the pulse width modulators may be divided into different groups (e.g., subsets), where each of the different groups implement the respective pulse widths in a different manner. Looking to operation 406, the pulse width modulators are thereby divided into a first subset and a second subset. In some approaches the pulse width modulators may be divided in half to form the first and second subsets. For example, pulse width modulators coupled to even ones of the linear extensions in the crossbar array may be assigned to the first subset, while pulse width modulators coupled to odd ones of the linear extensions in the crossbar array may be assigned to the second subset. It follows that the first and second subsets may be about the same size in some approaches. However, in other approaches the pulse width modulators may be divided according to any desired grouping.

Proceeding to operation 408, one or more instructions are sent to each pulse width modulator in the first subset, the one or more instructions being to actually apply a pulse of energy to each of the correlated rows and columns for an amount of time equal to the respective pulse widths. In other words, operation 408 includes causing each pulse width modulator in the first subset to apply a pulse of energy to the correlated unique row or column in an analog crossbar array while sequentially increasing a clock count from a first predetermined time to a second predetermined time. Moreover, these pulses of energy are applied by the pulse width modulators in the first subset beginning at start times and extending to end times for excitation periods that are equal to the respective pulse widths assigned to the pulse width modulators in the first subset. In other words, a "start time" is intended to refer to a definable point in time at which one or more pulse width modulators supply the leading edge of a pulse, while an "end time" refers to a definable point in time at which one or more pulse width modulators form the trailing edge of a pulse. The difference in time between the end time and the start time is thereby correlated to the pulse width (e.g., excitation period) of the resulting pulse formed. While the example indicated here uses an explicit clock signal and counter to control the duration timing, other approaches known to those skilled in the art, such as implicit timing from RC delays or cascaded delay stages, could similarly be used.

By increasing the clock count from the first predetermined time to a second predetermined time, a pulse width modulator is able to precisely keep track of the amount of time the pulse of energy has been applied to the given linear extension of the crossbar array. It follows that the first predetermined time may be set as time zero or t=0, while the second predetermined time may correspond to a longest possible pulse width. For instance, the number of bits of information being expressed by a given pulse of energy may dictate the longest possible pulse width. According to an example, a register having 6 bits of information is able to encode 64 distinct characters, and therefore a longest corresponding pulse width may be 64 clock cycles. Each clock cycle (also referred to herein as "clock count") may further correspond to 1 nanosecond in some approaches, but any desired timing scheme may be implemented depending on the desired approach. By maintaining a clock count allows for pulse width modulator to apply a given pulse that begins at a start time and extends a predetermined pulse width to end at the corresponding end time, e.g., as would be appreciated by one skilled in the art after reading the present description.

Furthermore, operation 410 includes sending one or more instructions to each pulse width modulator in the second subset, the one or more instructions being to actually apply a pulse of energy to each of the correlated rows and columns for an amount of time equal to the respective pulse widths. In other words, operation 410 includes causing each pulse width modulator in the second subset to apply a pulse of energy to the correlated unique row or column in an analog crossbar array while sequentially decreasing a clock count from the second predetermined time to the first predetermined time. Moreover, these pulses of energy are applied by the pulse width modulators in the second subset for excitation periods beginning at start times and extending to end times to form the respective pulse widths assigned to the pulse width modulators in the second subset.

By sequentially decreasing the clock count for the pulse width modulators in the second subset while sequentially increasing the clock count for the pulse width modulators in the first subset, method 400 is desirably able to reduce the number of leading and trailing edges of the pulses that coincide. For instance, because each of the pulse width modulators in the first subset apply pulses of varying widths beginning at a same first predetermined time (e.g., t=0), only the leading edges of the pulses applied by the pulse width modulators in the first subset coincide.

In other words, by dividing the pulse width modulators in half and applying the corresponding pulses of energy differently for the two subsets, the number of leading edges that coincide is immediately cut in half, e.g., compared to conventional implementations. Moreover, because the different pulses of energy correspond to different pulse widths, the trailing edges (e.g., "end times") of the pulses applied by the pulse width modulators in the first subset are distributed across different times between the first and second predetermined times.

This distribution is predetermined based on the pulse widths corresponding to the pulse width modulators in the first subset. This further reduces the amount of current draw experienced by the system as well as the inefficiencies associated with applying all pulses simultaneously.

Similarly, because each of the pulse width modulators in the second subset apply pulses of varying widths ending at a same time (e.g., the second predetermined time), only the trailing edges of the pulses applied by the pulse width modulators in the second subset coincide. Moreover, because the different pulses of energy correspond to different pulse widths and are configured to end simultaneously, the leading edges (e.g., "start times") of the pulses applied by the pulse width modulators in the second subset are thereby distributed across different times between the first and second predetermined times.

This distribution is again predetermined based on the pulse widths corresponding to the pulse width modulators in the second subset. Accordingly, a central operating clock may maintain a counter that can be used to synchronize the different pulse widths to end at a same point in time. Again, this significantly reduces the amount of current draw experienced by the system as well as the inefficiencies associated with applying all pulses simultaneously.

Figure 4B:
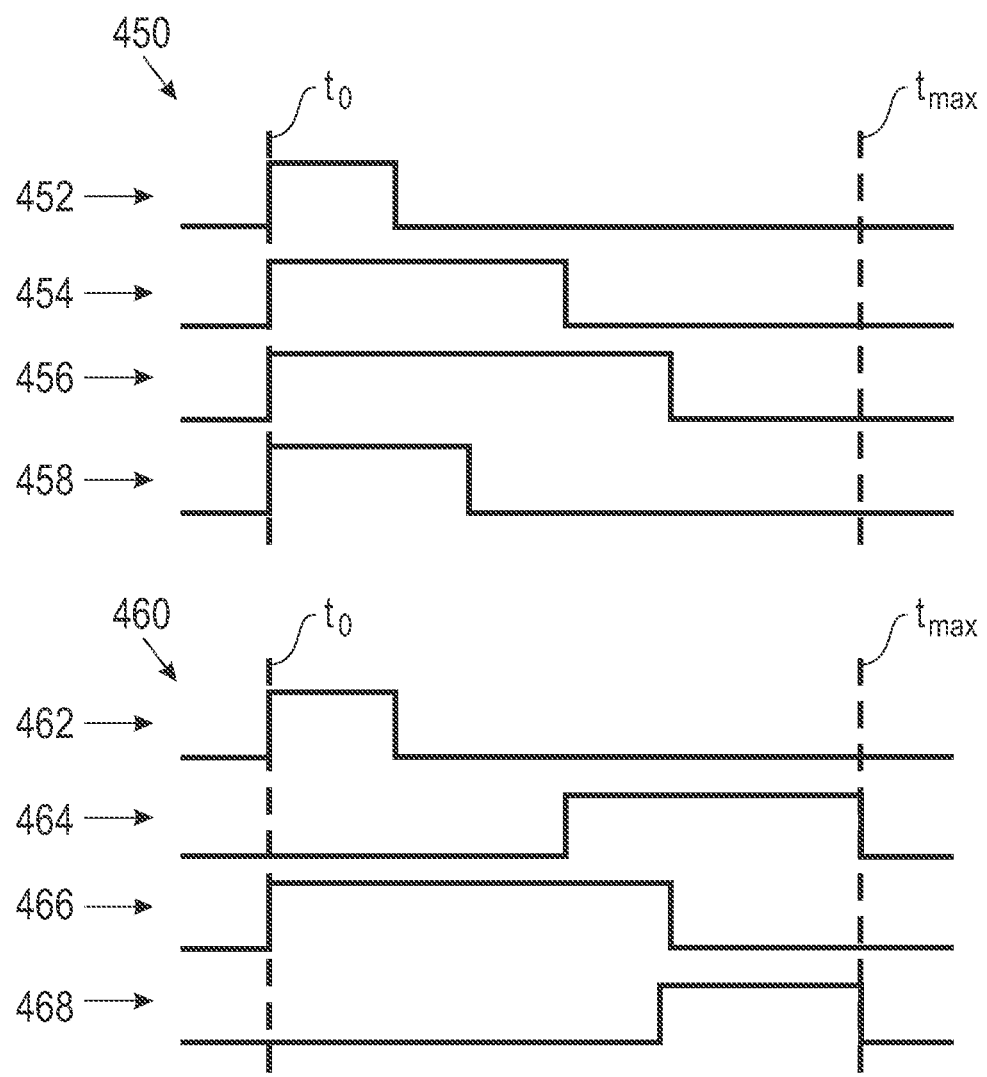
FIG. 4B is a representational view of two different signal alignment configurations according to two different examples.

Referring momentarily to FIG. 4B, two different signal alignment configurations 450, 460 are illustrated in an attempt to depict the improvements achieved by various ones of the processes in method 400. As shown, the conventional signal alignment configuration 450 includes a number of signal pulses 452, 454, 456, 458, each of which have a leading edge that coincides with each other. This is undesirable as the system experiences a significant current draw at to because all pulses are initiated at the same time.

However, the distributed signal alignment configuration 460 is depicted as significantly reducing the number of pulse edges that coincide. Specifically, by dividing the corresponding pulse width modulators in half, a first half of the pulse width modulators initiate pulses of energy at to which have distributed trailing edges (see signal pulses 462, 466), while a second half of the pulse width modulators initiate pulses of energy in a distributed manner while the trailing edge of the pulses coincide at $t_{max}$ (see signal pulses 464, 468). Again, this advantageously reduces current draw experienced by the system while also ensuring data retention, the efficiency of the system, etc., remain desirable. Moreover, the distributions are predetermined based on the pulse widths that actually correspond to the respective pulse width modulators in some approaches.

It follows that various ones of the processes included in method 400 are able to significantly reduce the number of rising and falling pulse edges that coincide. This again greatly reduces the strain placed on the system and components therein (e.g., such as a current and/or voltage source) by reducing the current draw experienced at any given time. However, the pulses may be implemented differently in other embodiments.

For instance, looking now to FIG. 5A, method 500 includes receiving a plurality of pulse widths, each of which corresponds to a respective pulse width modulator. See operation 502. As mentioned above, the "pulse width" represents a measurement that indicates the desired amount of time that elapses between the leading and trailing edges (e.g., start and end times) of a single pulse of energy. A pulse width may thereby be applied by a pulse width modulator by supplying a pulse of energy for an excitation period that is equal to the pulse width beginning at a corresponding start time and concluding at a corresponding end time, e.g., as would be appreciated by one skilled in the art after reading the present description.

It should also be noted that the pulse widths may be received from a user, a running application, a lookup table, etc. Moreover, although the pulse widths are illustrated as being received in the present embodiment, the pulse widths may be calculated based on past operations, determined using industry standards, dictated by the types of memory and/or components therein, etc.

Again, pulse width modulators may be used to apply energy pulses of certain lengths (e.g., durations) to specific ones of the linear extensions (e.g., rows and/or columns) in a crossbar array. In such approaches, each pulse width modulator may correlate with a unique row or column in an analog crossbar array. It follows that the use of the terms "row" and "column" as used herein are in no way intended to limit the invention. In some approaches columns and rows may even be used interchangeably, e.g., depending on the configuration of the crossbar array. The analog crossbar array may further be implemented in resistive memory in some instances, e.g., such as RRAM, or other types of memory, e.g., such as PCM. Each of the pulse width modulators may thereby be correlated with a specific row or column of RRAM or PCM circuitry.

In some approaches, the pulse widths themselves may identify which of the pulse width modulators they are correlated with. For instance, the pulse widths may include metadata which indicates which pulse width modulator is associated with each of the pulse widths. However, the correlation between the pulse widths and the pulse width modulators may be established using any desired information and/or processes. Accordingly, operation 504 includes assigning each of the pulse widths to the respective pulse width modulator that corresponds thereto.

A specific pulse width may be assigned to a given pulse width modulator in some approaches by storing a value representing the pulse width in pulse width modulator internal memory. For instance, a pulse width modulator may include a metadata header, a lookup table, a pulse queue, etc., that may be used to store one or more pulse widths therein.

While a respective pulse width may be assigned to each of the pulse width modulators, the pulse width modulators themselves may implement the pulse widths differently. For instance, different register values may be assigned to each of the pulse width modulators. Looking to operation 506, a random first register value is assigned to each of the pulse width modulators, while operation 508 includes assigning a second register value to each of the pulse width modulators. The second register values that are assigned to the pulse width modulators are preferably equal to the sum of the respective random first register value, and an excitation period equal to the pulse width assigned to the respective pulse width modulator. In other words, the second register value that is assigned to a given one of the pulse width modulators is preferably equal to a sum of: the random first register value that was assigned to the given pulse width modulator, and an excitation period equal to the pulse width assigned to the given pulse width modulator.

By assigning a random first register value to each of the pulse width modulators and using the random first register values in an increasing clock (e.g., counter) to determine when the leading edges of energy pulses should be implemented, method 500 is able to distribute the leading edges of the energy pulses that are ultimately created. As noted above, this desirably reduces the strain placed on the system and the various components included therein by significantly reducing the number of leading pulse edges that coincide. It should also be noted that the random first register value may be obtained differently depending on the particular approach. For instance, in some approaches the random first register value may be obtained using a random number generator, while in other approaches a random value may be based on user input, by applying a predetermined equation, etc.

Moreover, the second register value may be used to actually determine how long the energy pulse should be applied to the respective row or column of the analog crossbar array after the random first register value has been met. It follows that operation 510 includes causing each pulse width modulator to apply a pulse to the correlated unique row or column while sequentially increasing a clock count from a first predetermined time (e.g., value) to a second predetermined time (e.g., value). The second predetermined time may thereby be greater than the first predetermined time in some approaches, but this is in no way intended to limit the invention. For instance, rather than implementing an increasing clock or counter, equivalent types of counters may be implemented depending on the desired approach, e.g., such as a decreasing counter.

Figure 5B:
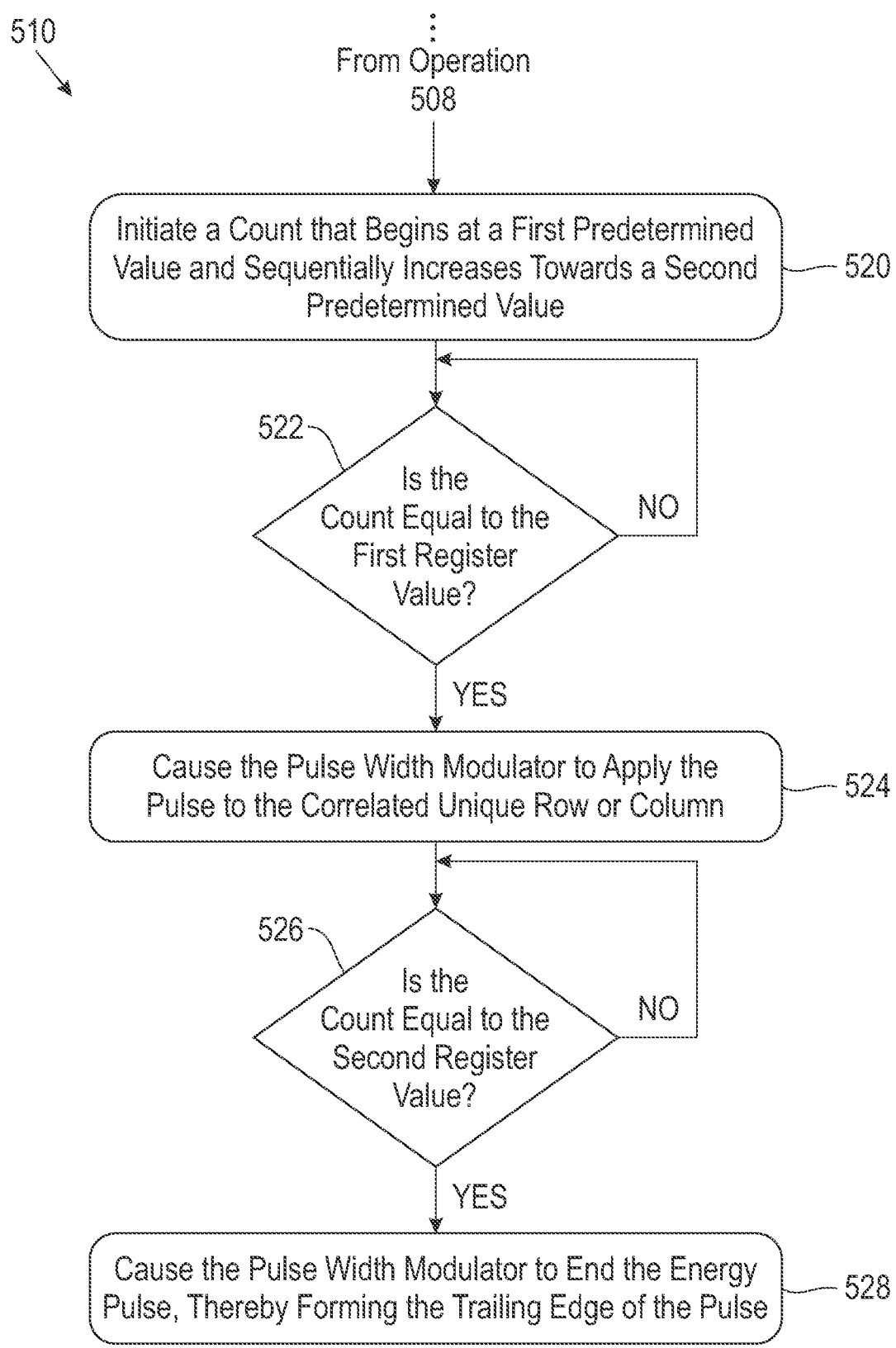
FIG. 5B is a flowchart of sub-processes for one of the operations in the method of FIG. 5A, in accordance with one embodiment.

The process of actually applying a pulse to the correlated unique row or column while sequentially increasing a clock count from the first predetermined time to the second predetermined time utilizes the first and second register values. For instance, referring momentarily now to FIG. 5B, exemplary sub-processes of causing each pulse width modulator to apply a pulse to the correlated unique row or column while sequentially increasing a clock count from a first predetermined time to a second predetermined time are illustrated in accordance with one embodiment. It follows that one or more of these sub-processes may be used to perform operation 510 of FIG. 5A for a given one of the pulse width modulators. However, it should be noted that the sub-processes of FIG. 5B are illustrated in accordance with one embodiment which is in no way intended to limit the invention.

As shown, sub-operation 520 includes initiating a clock count that begins at a first predetermined value and sequentially increases towards a second predetermined value. As noted above, the first predetermined value may simply be treated as starting point for the clock count and thereby may be identified as to, while the second predetermined value may correspond to a longest possible pulse width, e.g., as would be appreciated by one skilled in the art after reading the present description. The clock count may actually be implemented using any desired timing scheme, logical and/or physical components, etc., depending on the approach. For instance, in some approaches the clock count may be initiated by actually starting a counter that is able to sequentially increase from the first predetermined value to the second predetermined value.

Decision 522 further includes determining whether the clock count is equal to the first register value assigned to the given pulse width modulator. As noted above, the first register values are random and therefore each of the pulse width modulators have a different first register value assigned thereto in order to distribute the rising edges of the pulses, e.g., as described above.

In response to determining that the clock count is not yet equal to the first register value assigned to the given pulse width modulator, the flowchart waits a predetermined amount of time before repeating decision 522. The predetermined amount of time may correspond to a certain number of clock cycles (or "clock counts"), counter increments, user input, past performance, etc. It follows that decision 522 may be repeated any desired number of times before determining that the clock count has reached the first register value assigned to the given pulse width modulator.

From decision 522, the flowchart proceeds to sub-operation 524 in response to determining that the clock count has reached the first register value assigned to the given pulse width modulator. There, sub-operation 524 includes causing the pulse width modulator to apply the pulse to the unique row or column that is correlated thereto. As mentioned above, the random first register values are assigned to the pulse width modulators in an effort to distribute the leading edges of the energy pulses that are created which desirably reduces strain on the system while implementing various pulse widths. Thus, when the counter determines that the random first register value assigned to the given pulse width modulator has been reached, the actual pulse of energy may be initiated.

While the energy pulse is being applied by the given pulse width modulator, the counter continues to advance from the first predetermined value (e.g., $t_0$) to the second predetermined value. This allows the system to precisely determine how long the energy pulse has been active and when the trailing edge should be implemented. Accordingly, decision 526 includes determining whether the clock count is equal to the second register value assigned to the pulse width modulator. In other words, decision 526 includes determining whether the full pulse width has been applied to the row or column of the crossbar array.

In response to determining that the clock count is not yet equal to the second register value assigned to the pulse width modulator, the flowchart preferably continues to apply the energy pulse and thereby effectively waits a predetermined amount of time before returning to decision 526 as shown. However, the flowchart does proceed to sub-operation 528 in response to determining that the clock count is equal to the second register value assigned to the given pulse width modulator. There, sub-operation 528 includes causing the pulse width modulator to end the energy pulse, thereby forming the trailing edge of the pulse.

As noted above, this implementation is able to successfully distribute both the leading and trailing edges of the pulses applied by the pulse width modulators between the first and second predetermined times. Again, this advantageously reduces current draw experienced by the system while also ensuring data retention, the efficiency of the system, etc., remain desirable.

Figure 5C:
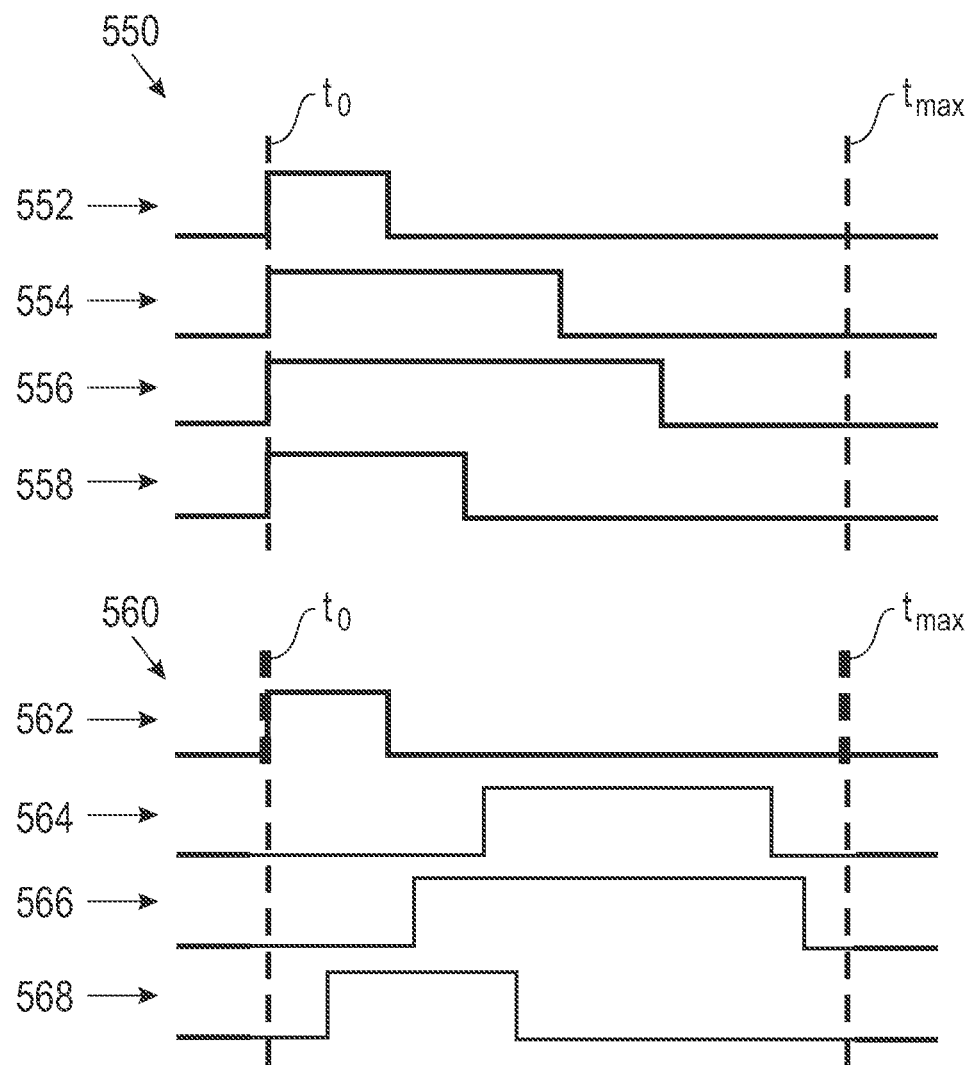
FIG. 5C is a representational view of two different signal alignment configurations according to two different examples.

Referring momentarily to FIG. 5C, two different signal alignment configurations 550, 560 are illustrated in an attempt to depict the improvements achieved by various ones of the processes in method 500. As shown, the conventional signal alignment configuration 550 includes a number of signal pulses 552, 554, 556, 558, each of which have a leading edge that coincides with each other. This is undesirable as the system experiences a significant current draw at to because all pulses are initiated at the same time.

However, the distributed signal alignment configuration 560 is depicted as significantly reducing the number of pulse edges that coincide. Specifically, by assigning a random first register value to each of the pulse width modulators, the leading and trailing edges of the energy pulses are initiated in a distributed fashion. For instance, each of the signal pulses 562, 564, 566, 568 have leading and trailing edges that do not coincide with each other. Again, this advantageously reduces current draw experienced by the system while also ensuring data retention, the efficiency of the system, etc., remain desirable.

It follows that various ones of the processes included in method 500 are able to significantly reduce the number of rising and falling pulse edges that coincide. This again greatly reduces the strain placed on the system and components therein (e.g., such as a current and/or voltage source) by reducing the current draw experienced at any given time. However, the pulses may be implemented differently in other embodiments.

For instance, looking now to FIG. 6A, method 600 includes receiving a plurality of pulse widths, each of which corresponds to a respective pulse width modulator. See operation 602. As mentioned above, the "pulse width" represents a measurement that indicates the desired amount of time that elapses between the leading and trailing edges of a single pulse of energy. A pulse width may thereby be applied by a pulse width modulator by supplying a pulse of energy for an excitation period that is equal to the pulse width, e.g., as would be appreciated by one skilled in the art after reading the present description.

It should also be noted that the pulse widths may be received from a user, a running application, a lookup table, etc. Moreover, although the pulse widths are illustrated as being received in the present embodiment, the pulse widths may be calculated based on past operations, determined using industry standards, dictated by the types of memory and/or components therein, etc.

Again, pulse width modulators may be used to apply energy pulses of certain lengths (e.g., durations) to specific ones of the linear extensions (e.g., rows and/or columns) in a crossbar array. In such approaches, each pulse width modulator may correlate with a unique row or column in an analog crossbar array. It follows that the use of the terms "row" and "column" as used herein are in no way intended to limit the invention. In some approaches columns and rows may even be used interchangeably, e.g., depending on the configuration of the crossbar array. The analog crossbar array may further be implemented in resistive memory in some instances, e.g., such as RRAM, or other types of memory, e.g., such as PCM. Each of the pulse width modulators may thereby be correlated with a specific row or column of RRAM or PCM circuitry.

In some approaches, the pulse widths themselves may identify which of the pulse width modulators they are correlated with. For instance, the pulse widths may include metadata which indicates which pulse width modulator is associated with each of the pulse widths. However, the correlation between the pulse widths and the pulse width modulators may be established using any desired information and/or processes. Accordingly, operation 604 includes assigning each of the pulse widths to the respective pulse width modulator that corresponds thereto.

A specific pulse width may be assigned to a given pulse width modulator in some approaches by storing data representing the pulse width in pulse width modulator internal memory. For instance, a pulse width modulator may include a metadata header, a lookup table, a pulse queue, etc., that may be used to store one or more different types of pulse width data therein. It follows that the pulse width modulators themselves may store any desired data that is at least somewhat associated with the pulse width. According to an example, a pulse width modulator may store pulse width data indicating the specific width (e.g., start and stop times) of a particular pulse, the row and/or column in a crossbar array which the pulse should be applied to, an amount of voltage to apply to form the pulse, etc.

While a respective pulse width may be assigned to each of the pulse width modulators, the pulse width modulators themselves may implement the pulse widths differently. For instance, different register values may be assigned to each of the pulse width modulators. Looking to operation 606, a register value is assigned to each of the pulse width modulators. The register value assigned to a given one of the pulse width modulators is preferably equal to the pulse width assigned to the given pulse width modulator, and may thereby represent the amount of time the energy pulse is to be applied by the given pulse width modulator to the correlated row or column in an analog crossbar array. Moreover, a register value may actually be assigned to a pulse width modulator by storing the register value in a metadata header, applying the register value to internal settings of the pulse width modulator, saving the register value in a lookup table, etc.

Operation 608 further includes causing each pulse width modulator to apply a pulse to the correlated unique row or column. As shown in FIG. 6A, operation 608 actually includes a number of sub-processes, one or more of which may be used to actually apply the pulse to the correlated row or column. However, it should be noted that the sub-processes of operation 608 are illustrated in accordance with one embodiment which is in no way intended to limit the invention.

Sub-operation 608A is depicted as using all bits except for a least significant bit in the register value assigned to the given pulse width modulator to determine a partial excitation period. By ignoring the least significant bit in the register value, the partial excitation period only represents a portion of the total excitation period that corresponds to the given register value. Again, register value assigned to a given one of the pulse width modulators is preferably equal to the pulse width assigned to the given pulse width modulator, and may thereby represent the amount of time the energy pulse is to be applied by the given pulse width modulator to the correlated row or column in an analog crossbar array. It follows that by temporarily ignoring the least significant bit, the process is able to reduce the total current draw for the system, e.g., as will be described in further detail below.

Sub-operation 608B further includes dividing the partial excitation period in half. By dividing the partial excitation period in half, the corresponding pulse width modulator is able to apply a first half of the partial excitation period while decrementing a counter, and the second half of the partial excitation period while incrementing the counter. Accordingly, sub-operation 608C includes causing the given pulse width modulator to apply a pulse to the correlated unique row or column while sequentially decreasing a clock count from a first predetermined value to a second predetermined value, while sub-operation 608D includes causing the given pulse width modulator to continue applying the pulse to the correlated unique row or column while sequentially increasing the clock count from the second predetermined value to the first predetermined value.

In some approaches, the clock count is a timer. Moreover, the first predetermined value may be equal to zero (e.g., to), wherein the second predetermined value is equal to one clock cycle less than half of the partial excitation period. In other words, the second predetermined value is equal to the result of [½*(partial excitation period)−1]. It follows that when the counter reaches the first predetermined value after counting down to the second predetermined value, the partial excitation period has completed and the relevant pulse width has been implemented in memory except for the portion that corresponds to the previously ignored least significant bit.

In other words, the pulse applied by the given pulse width modulator as a result of performing sub-operation 608C corresponds to a first half of the partial excitation period, while the pulse applied by the given pulse width modulator as a result of performing sub-operation 608D corresponds to a second half of the partial excitation period. Together, sub-operations 608C and 608D result in the partial excitation period being implemented in memory.

The difference between the first predetermined value and the second predetermined value may thereby correspond to half of the partial excitation period. Accordingly, the pulse width assigned to the given pulse width modulator has not fully been implemented in memory, even in response to the partial excitation period being implemented in memory. Decision 608E thereby includes determining whether the clock count is equal to the first predetermined value. In response to determining that the clock count is not equal to the first predetermined value, the flowchart is shown as returning to decision 608E. Accordingly, the decision may be repeated after a predetermined amount of time has passed in order to determine if the clock count is equal to the first predetermined value. It follows that decision 608E may be repeated any desired number of times while implementing a given pulse width in memory.

In response to determining that the clock count is equal to the first predetermined value, the flowchart is shown as advancing to decision 608F. There, decision 608F includes determining whether the least significant bit in the register value assigned to the given pulse width modulator is set. As noted above, the least significant bit of the register value is temporarily ignored when determining the partial excitation period. It follows that once the partial excitation period has been implemented in memory, the full pulse width may not have been fully implemented yet. Determining whether the least significant bit in the register value is set thereby effectively determines whether additional excitation should be implemented.

Accordingly, in response to determining that the least significant bit in the register value assigned to the given pulse width modulator is set, decision 608F essentially determines that the least significant bit has not yet been represented. The flowchart thereby proceeds to sub-operation 608G which includes causing the given pulse width modulator to continue applying the pulse to the correlated unique row or column for one additional clock count. The additional clock count may be one additional iteration of a clock cycle timing structure in some approaches, while in other approaches the additional clock count may be predetermined by a user, be based on industry standards, be determined based on the type of memory, etc. According to an example, sub-operation 608G may include causing the pulse width modulator to continue applying the pulse for one additional nanosecond past the point in time at which it was determined that the clock count is equal to the first predetermined value and determined that the least significant bit in the register value assigned to the given pulse width modulator is set.

From sub-operation 608G, method 600 advances to operation 610 whereby the given pulse width modulator is instructed to end the pulse. The full pulse width has been implemented and method 600 is thereby effectively ended in response to operation 610 being satisfied. Moreover, returning to decision 608F, it is shown that the flowchart proceeds directly to operation 610 in response to determining that the least significant bit in the register value assigned to the given pulse width modulator is not set. In other words, the pulse width modulator is instructed to end the pulse in response to the partial excitation period being implemented as it actually represented the entire pulse width, e.g., as would be appreciated by one skilled in the art after reading the present description.

It follows that the leading and trailing edges of the pulses applied by pulse width modulators as a result of implementing various ones of the processes and/or sub-processes in method 600 are distributed across different times between the first and second predetermined values. As noted above, this increased distribution of the leading and trailing edges of pulse excitations significantly reduces current draws experienced by the system which in turn increases efficiency as a whole.

Figure 6B:
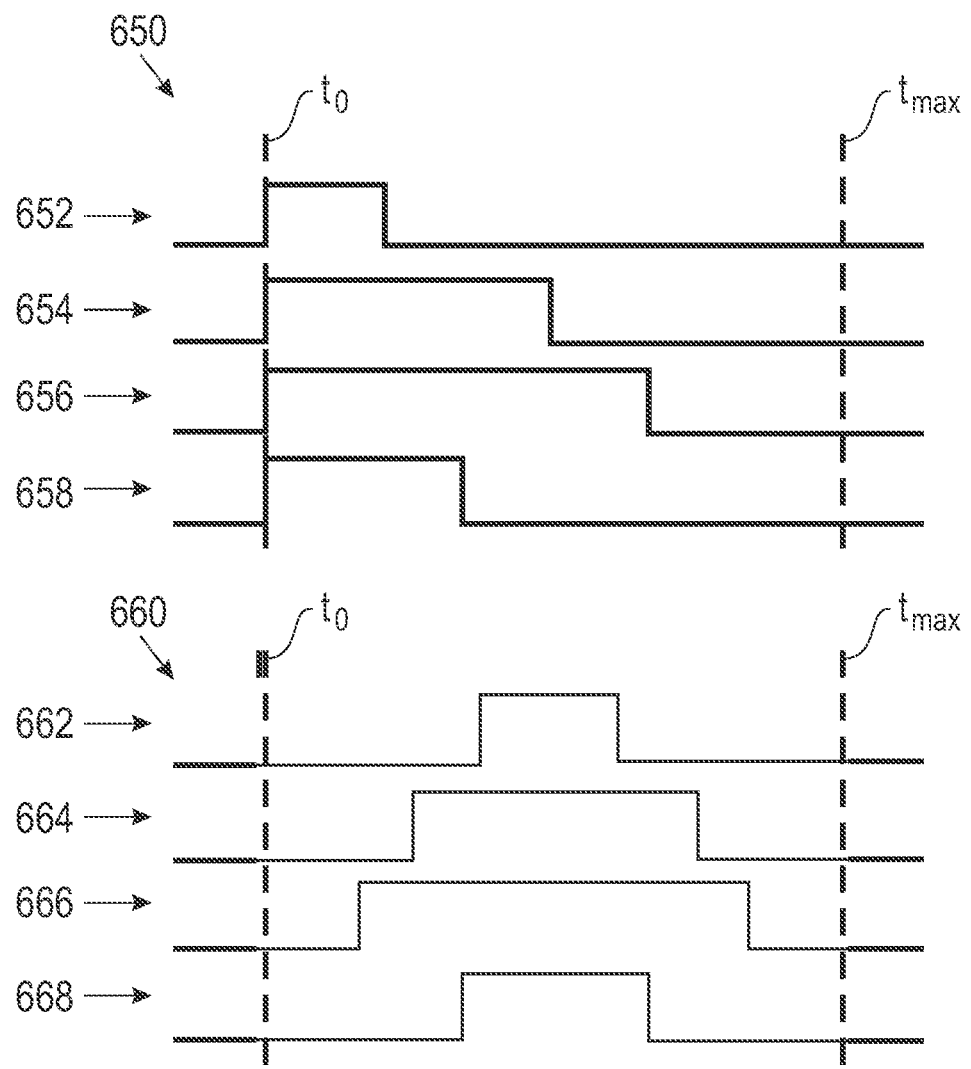
FIG. 6B is a representational view of two different signal alignment configurations according to two different examples.

Looking now to FIG. 6B momentarily, two different signal alignment configurations 650, 660 are illustrated in an attempt to depict the improvements achieved by various ones of the processes in method 600. As shown, the conventional signal alignment configuration 650 includes a number of signal pulses 652, 654, 656, 658, each of which have a leading edge that coincides with each other. This is undesirable as the system experiences a significant current draw at to because all pulses are initiated at the same time.

However, the distributed signal alignment configuration 660 is depicted as significantly reducing the number of pulse edges that coincide in signal pulses 662, 664, 666, 668. Specifically, by assigning a register value to each of the pulse width modulators equal to the excitation period associated with the desired pulse width, each pulse width modulator (e.g., each column or row of the crossbar array) has only one overall register. Moreover, by dividing the register value (e.g., maximum pulse duration) into two halves, larger register values desirably lead to an earlier rising edge, while smaller register values lead to a later rising edge. For instance, in the first half, all bits in the register except the least significant bit are used in a countdown scheme, while in the second half, the pulse width modulator enters a count up mode, again using the values in the register except for the least significant bit.

At the point in time at which the counter reaches the value in the register subset (e.g., all bits in the register value except the least significant bit), the pulse is either turned off immediately if the least significant bit is 0, or held on for 1 additional tick value if the least significant bit is 1. As a result, the only pulses that turn on at the beginning of the maximum pulse duration and turn off at the end of the maximum pulse duration are pulses of maximum duration. Other pulses will start and end somewhere within the total duration, with short pulses bunched at the halfway point, e.g., as seen in distributed signal alignment configuration 660. Again, this desirably distributed the rising and falling edges of the various pulses that are implemented, especially in comparison to the pulses seen in conventional signal alignment configuration 650.

Again, it follows that various ones of the processes included in method 600 are able to significantly reduce the number of rising and falling pulse edges that coincide. This greatly reduces the strain placed on the system and components therein (e.g., such as a current and/or voltage source) by reducing the current draw experienced at any given time and increases efficiency as a whole.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 7:
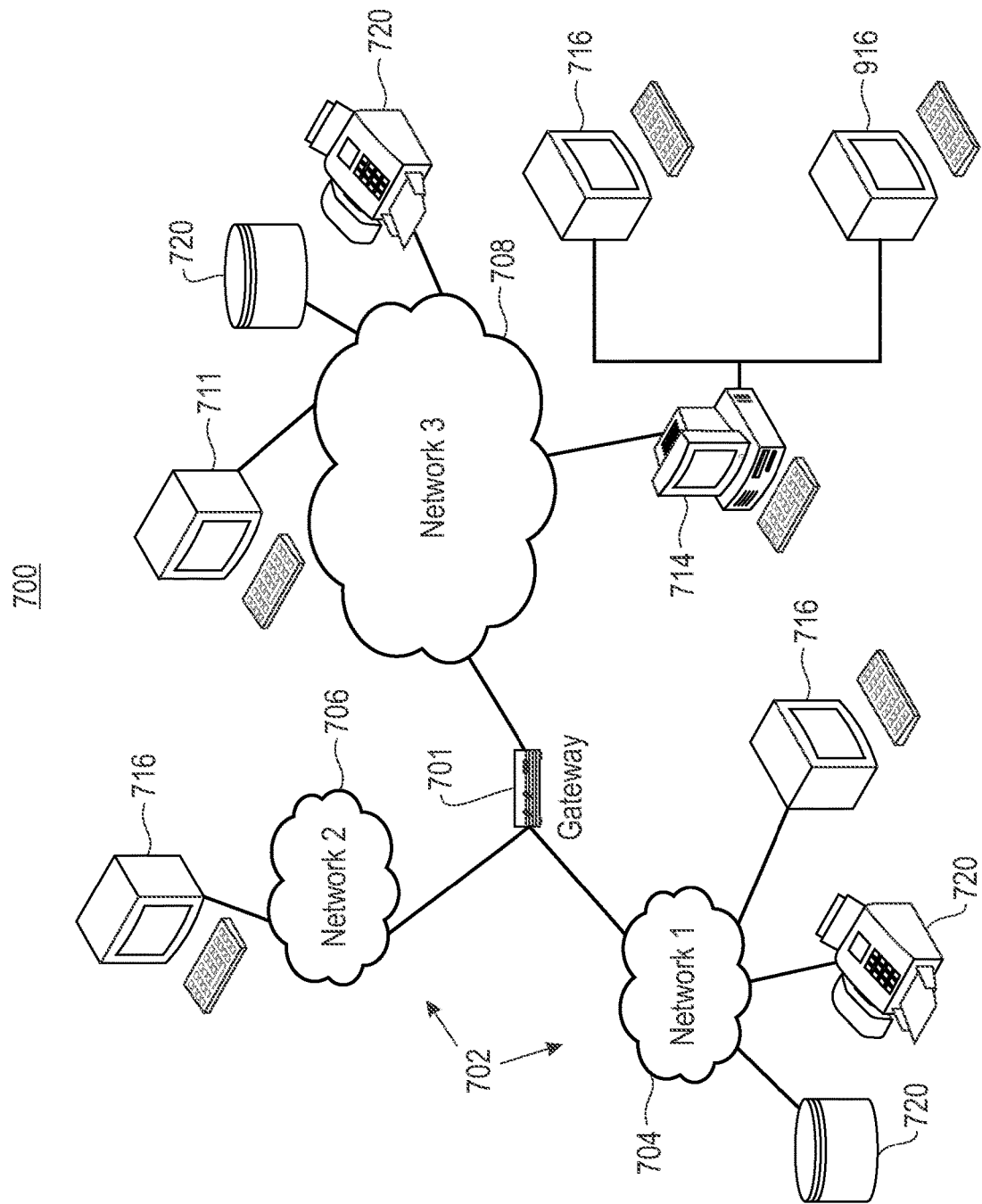
FIG. 7 is a network architecture, in accordance with one embodiment.

For instance, FIG. 7 illustrates a network architecture 700, in accordance with one embodiment. As shown in FIG. 7, a plurality of remote networks 702 are provided including a first remote network 704 and a second remote network 706. A gateway 701 may be coupled between the remote networks 702 and a proximate network 708. In the context of the present network architecture 700, the networks 704, 706 may each take any form including, but not limited to a LAN, a WAN such as the Internet, public switched telephone network (PSTN), internal telephone network, etc.

In use, the gateway 701 serves as an entrance point from the remote networks 702 to the proximate network 708. As such, the gateway 701 may function as a router, which is capable of directing a given packet of data that arrives at the gateway 701, and a switch, which furnishes the actual path in and out of the gateway 701 for a given packet.

Further included is at least one data server 714 coupled to the proximate network 708, and which is accessible from the remote networks 702 via the gateway 701. It should be noted that the data server(s) 714 may include any type of computing device/groupware. Coupled to each data server 714 is a plurality of user devices 716. Such user devices 716 may include a desktop computer, laptop computer, handheld computer, printer, and/or any other type of logic-containing device. It should be noted that a user device 711 may also be directly coupled to any of the networks, in some embodiments.

A peripheral 720 or series of peripherals 720, e.g., facsimile machines, printers, scanners, hard disk drives, networked and/or local data storage units or systems, etc., may be coupled to one or more of the networks 704, 706, 708. It should be noted that databases and/or additional components may be utilized with, or integrated into, any type of network element coupled to the networks 704, 706, 708. In the context of the present description, a network element may refer to any component of a network.

According to some embodiments, methods and systems described herein may be implemented with and/or on virtual systems and/or systems which emulate one or more other systems, such as a UNIX® system which virtually hosts a known operating system environment, etc. This virtualization and/or emulation may be enhanced through the use of VMware® software, in some embodiments.

In other embodiments, one or more networks 704, 706, 708, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 8:
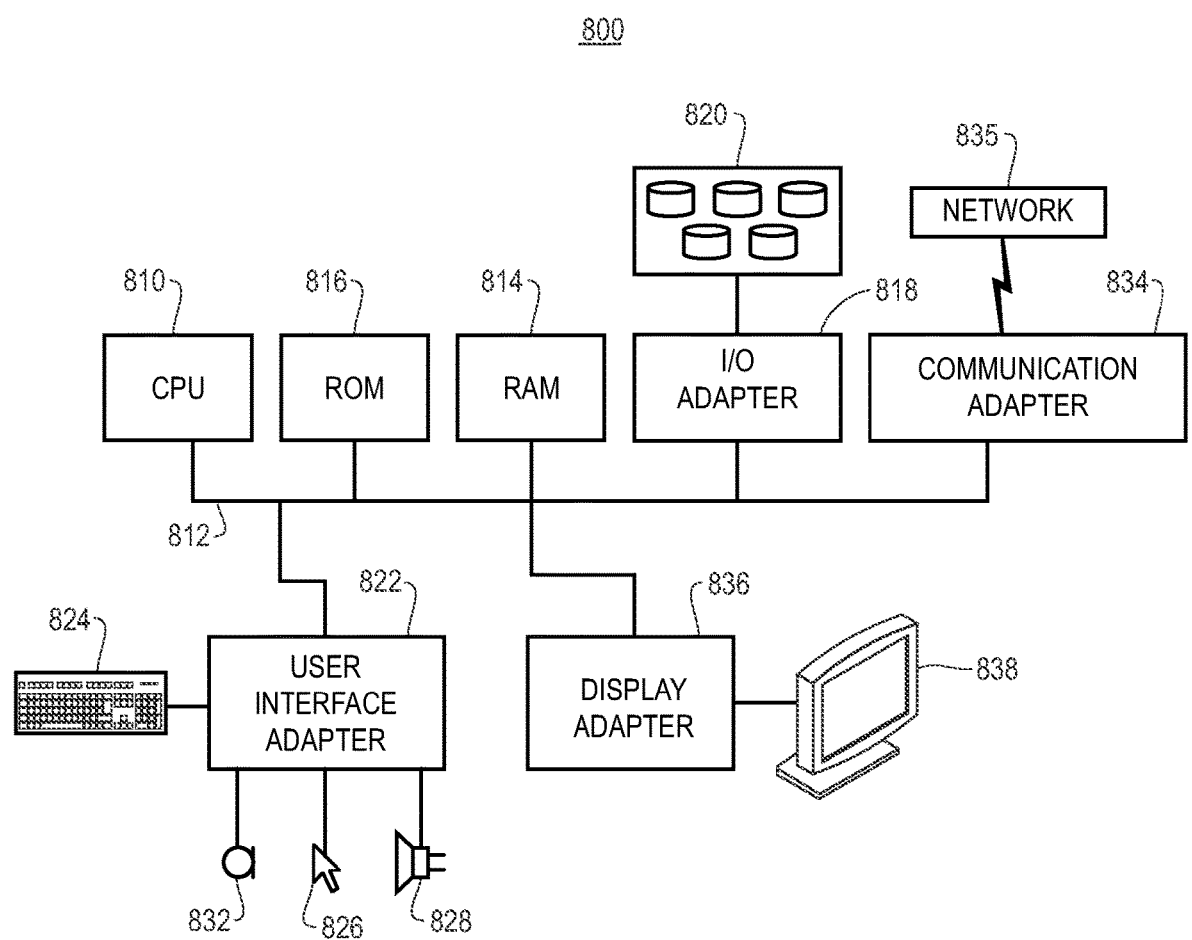
FIG. 8 is a representative hardware environment that may be associated with the servers and/or clients of FIG. 7, in accordance with one embodiment.

FIG. 8 shows a representative hardware environment associated with a user device 716 and/or server 714 of FIG. 7, in accordance with one embodiment. FIG. 8 illustrates a typical hardware configuration of a processor system 800 having a central processing unit 810, such as a microprocessor, and a number of other units interconnected via a system bus 812, according to one embodiment. In some embodiments, central processing unit 810 may include any of the approaches described above.

The processor system 800 shown in FIG. 8 includes a Random Access Memory (RAM) 814, Read Only Memory (ROM) 816, and an I/O adapter 818. According to some embodiments, which are in no way intended to limit the invention, I/O adapter 818 may include any of the approaches described above. Referring still to processor system 800 of FIG. 8, the aforementioned components 814, 816, 818 may be used for connecting peripheral devices such as storage subsystem 820 to the bus 812. In some embodiments, storage subsystem 820 may include a similar and/or the same configuration as any of the approaches included herein. According to an example, which is in no way intended to limit the invention, storage subsystem 820 may include non-volatile data storage cards, e.g., having NVRAM memory cards, RAM, ROM, and/or some other known type of non-volatile memory, in addition to RAID controllers.

With continued reference to FIG. 8, a user interface adapter 822 for connecting a keyboard 824, a mouse 826, a speaker 828, a microphone 832, and/or other user interface devices such as a touch screen, a digital camera (not shown), etc., to the bus 812.

Processor system 800 further includes a communication adapter 834 which connects the processor system 800 to a communication network 835 (e.g., a data processing network) and a display adapter 836 which connects the bus 812 to a display device 838.

The processor system 800 may have resident thereon an operating system such as the Microsoft® Windows® Operating System (OS), a macOS®, a UNIX® OS, etc. It will be appreciated that a preferred embodiment may also be implemented on platforms and operating systems other than those mentioned. A preferred embodiment may be written using Java®, XML, C, and/or C++ language, or other programming languages, along with an object oriented programming methodology. Object oriented programming (OOP), which has become increasingly used to develop complex applications, may be used.

Figure 9:
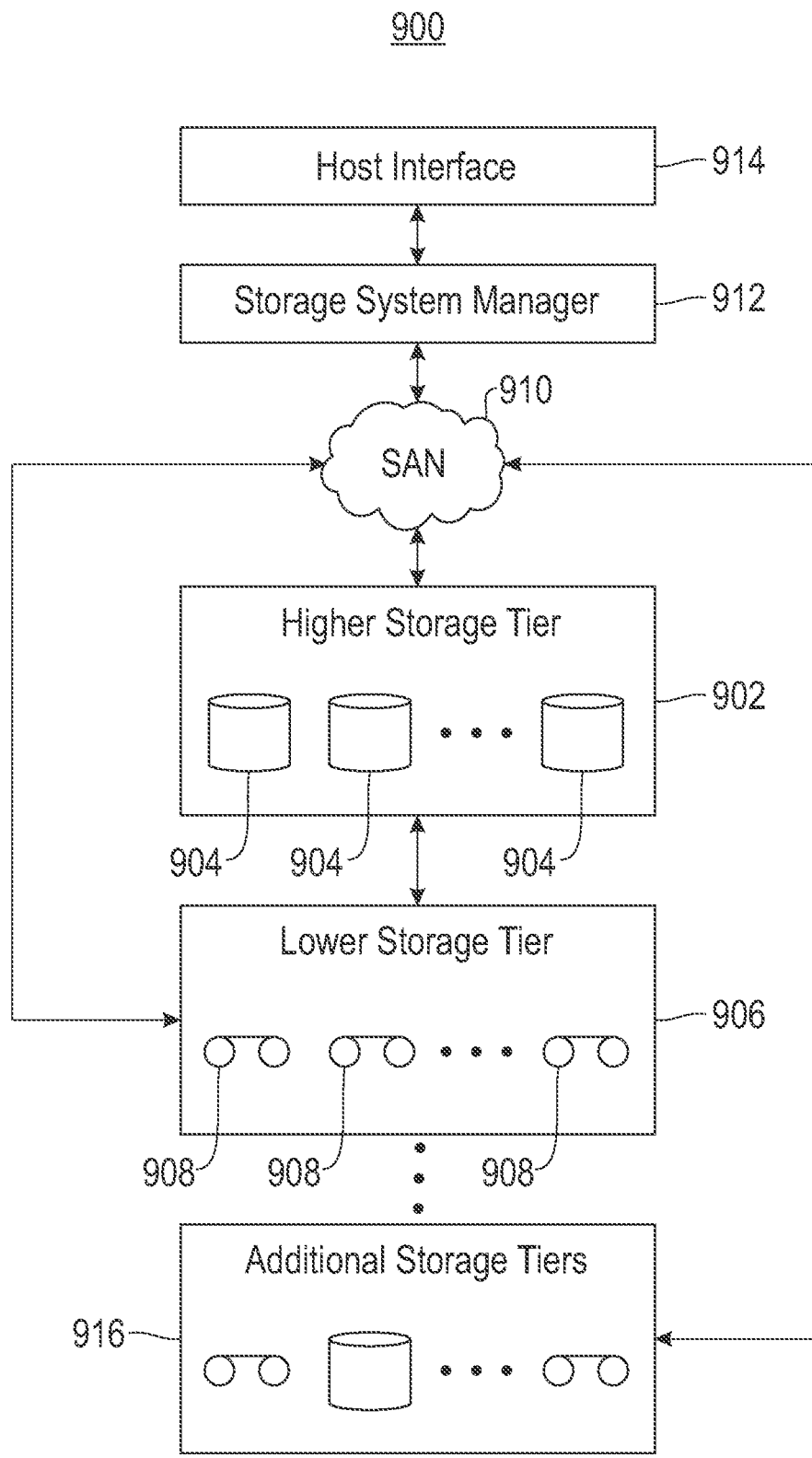
FIG. 9 is diagram of a tiered data storage system in accordance with one embodiment.

Moreover, FIG. 9 illustrates a storage system 900 which implements high level (e.g., SSD) storage tiers in combination with lower level (e.g., magnetic tape) storage tiers, according to one embodiment. Note that some of the elements shown in FIG. 9 may be implemented as hardware and/or software, according to various embodiments. The storage system 900 may include a storage system manager 912 for communicating with a plurality of media on at least one higher storage tier 902 and at least one lower storage tier 906. However, in other approaches, a storage system manager 912 may communicate with a plurality of media on at least one higher storage tier 902, but no lower storage tier. The higher storage tier(s) 902 preferably may include one or more random access and/or direct access media 904, such as hard disks, NVM, NVRAM, solid state memory in SSDs, MRAM, SSD arrays, flash memory arrays, etc., and/or others noted herein or known in the art. According to illustrative examples, FIGS. 3-4 show exemplary architectures of SSD systems which may be used as a higher storage tier 902 depending on the desired embodiment.

Referring still to FIG. 9, the lower storage tier(s) 906 preferably includes one or more lower performing storage media 908, including sequential access media such as magnetic tape in tape drives and/or optical media, slower accessing HDDs, slower accessing SSDs, etc., and/or others noted herein or known in the art. One or more additional storage tiers 916 may include any combination of storage memory media as desired by a designer of the system 900. Thus, the one or more additional storage tiers 916 may, in some approaches, include a SSD system architecture similar to those that would be apparent to one skilled in the art after reading the present description. Also, any of the higher storage tiers 902 and/or the lower storage tiers 906 may include any combination of storage devices and/or storage media.

The storage system manager 912 may communicate with the storage media 904, 908 on the higher storage tier(s) 902 and lower storage tier(s) 906 through a network 910, such as a storage area network (SAN), as shown in FIG. 9, or some other suitable network type. The storage system manager 912 may also communicate with one or more host systems (not shown) through a host interface 914, which may or may not be a part of the storage system manager 912. The storage system manager 912 and/or any other component of the storage system 900 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 900 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 902, may include a majority of SSD storage media for storing data in a higher performing storage environment, and remaining storage tiers, including lower storage tier 906 and additional storage tiers 916 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 902, while data not having one of these attributes may be stored to the additional storage tiers 916, including lower storage tier 906. Of course, one of skill in the art, upon reading the present descriptions, may devise many other combinations of storage media types to implement into different storage schemes, according to the embodiments presented herein.

According to some embodiments, the storage system (such as 900) may include logic configured to receive a request to open a data set, logic configured to determine if the requested data set is stored to a lower storage tier 906 of a tiered data storage system 900 in multiple associated portions, logic configured to move each associated portion of the requested data set to a higher storage tier 902 of the tiered data storage system 900, and logic configured to assemble the requested data set on the higher storage tier 902 of the tiered data storage system 900 from the associated portions.

Of course, this logic may be implemented as a method on any device and/or system or as a computer program product, according to various embodiments.

What is claimed is:

1. A computer-implemented method, comprising:
causing a first subset of pulse width modulators in a crossbar array of memory cells to apply respective pulses to the crossbar array together at a same start time and end the respective pulses according to a predetermined distribution of times correlated to stored pulse width data for each pulse width modulator; and
causing a second subset of pulse width modulators in the crossbar array to apply pulses to the crossbar array according to the predetermined distribution of times correlated to stored pulse width data for each pulse width modulator and end the respective pulses together at a same end time, wherein leading edges of the pulses applied by the pulse width modulators in the second subset are distributed between a first predetermined time and a second predetermined time, wherein trailing edges of the pulses applied by the pulse width modulators in the second subset coincide.

2. The computer-implemented method of claim 1, wherein causing the first subset of pulse width modulators in the crossbar array to apply the respective pulses to the crossbar array includes:
sequentially incrementing a first counter from a first predetermined time to a second predetermined time, wherein leading edges of the pulses applied by the pulse width modulators in the first subset coincide, wherein trailing edges of the pulses applied by the pulse width modulators in the first subset are distributed between the first and second predetermined times.

3. The computer-implemented method of claim 2, wherein the leading edges of the pulses applied by the pulse width modulators in the first subset coincide at the first predetermined time.

4. The computer-implemented method of claim 1, wherein causing the second subset of pulse width modulators in the crossbar array to apply the respective pulses to the crossbar array includes:
sequentially decrementing a second counter from a second predetermined time to a first predetermined time.

5. The computer-implemented method of claim 4, wherein the trailing edges of the pulses applied by the pulse width modulators in the second subset coincide at the first predetermined time.

6. The computer-implemented method of claim 1, wherein the crossbar array is an analog crossbar array in resistive memory.

7. The computer-implemented method of claim 6, wherein the resistive memory is Phase Change Memory (PCM).

8. The computer-implemented method of claim 6, wherein the resistive memory is Resistive Random Access Memory (RRAM).

9. A computer program product comprising a computer readable storage medium having program instructions embodied therewith, the program instructions readable and/or executable by a processor to cause the processor to:
assign, by the processor, random first register values to pulse width modulators in a crossbar array of memory cells;
cause, by the processor, the pulse width modulators to apply respective pulses to the crossbar array according to a first predetermined distribution of times correlated to the random first register values, by:
determining whether counts are equal to the random first register values assigned to the respective pulse width modulators, and
in response to determining that one or more counts are equal to the random first register values assigned to the respective one or more pulse width modulators, causing the one or more pulse width modulators to apply the respective pulses to unique rows and/or columns of the crossbar array; and cause, by the processor, the pulse width modulators to end their respective pulses according to a second predetermined distribution of times correlated to stored pulse width data for each pulse width modulator.

10. The computer program product of claim 9, wherein causing the pulse width modulators to apply respective pulses to the crossbar array according to a first predetermined distribution of times includes, for each pulse width modulator:
   determining whether the respective count is equal to a sum of: the random first register value assigned to the pulse width modulator, and stored pulse width data for the pulse width modulator; and
   in response to determining that the respective count is equal to the sum, causing the pulse width modulator to end the pulse.

11. The computer program product of claim 10, wherein the respective count sequentially increments from a first predetermined time to a second predetermined time, wherein leading and trailing edges of the pulses applied by the pulse width modulators are distributed between the first and second predetermined times.

12. The computer program product of claim 9, wherein the crossbar array is an analog crossbar array in resistive memory.

13. The computer program product of claim 12, wherein the resistive memory is Phase Change Memory (PCM).

14. The computer program product of claim 12, wherein the resistive memory is Resistive Random Access Memory (RRAM).

15. A system, comprising:
   a processor; and
   logic integrated with the processor, executable by the processor, or integrated with and executable by the processor, the logic being configured to:
   assign, by the processor, register values to pulse width modulators in a crossbar array of memory cells, wherein the register values assigned to the pulse width modulators are correlated to respective pulse widths assigned to the pulse width modulators; and
   cause, by the processor, the pulse width modulators to apply respective pulses to the crossbar array, wherein causing a given one of the pulse width modulators to apply a respective pulse to the crossbar array includes:
      using all bits except for a least significant bit in the register value assigned to the given pulse width modulator to determine a partial excitation period,
      dividing the partial excitation period in half,
      causing the given pulse width modulator to apply a pulse to the crossbar array for a first half of the partial excitation period,
      causing the given pulse width modulator to continue applying the pulse to the crossbar array for a second half of the partial excitation period, and
      in response to determining that the least significant bit in the register value assigned to the given pulse width modulator is not set, causing the given pulse width modulator to end the pulse.

16. The system of claim 15, wherein causing the given one of the pulse width modulators to apply a respective pulse to the crossbar array includes:
   in response to determining that the given pulse width modulator has applied the pulse to the crossbar array for the first and second halves of the partial excitation period, determine, by the processor, whether the least significant bit in the register value assigned to the given pulse width modulator is set; and
   in response to determining that the least significant bit in the register value assigned to the given pulse width modulator is set, cause, by the processor, the given pulse width modulator to continue applying the pulse to the crossbar array for one additional clock count.

17. The system of claim 15, wherein leading and trailing edges of the pulses applied by the pulse width modulators are distributed between first and second predetermined times.

18. The system of claim 15, wherein the crossbar array is an analog crossbar array in resistive memory.

19. The system of claim 18, wherein the resistive memory is Phase Change Memory (PCM).

* * * * *